United States Patent
Seo

(10) Patent No.: US 11,277,577 B2
(45) Date of Patent: Mar. 15, 2022

(54) CHARGE PUMP CIRCUIT AND IMAGE SENSOR COMPRISING THE SAME

(71) Applicant: SAMSUNG ELECTRONICS CO., LTD., Suwon-si (KR)

(72) Inventor: Minwoong Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/859,041

(22) Filed: Apr. 27, 2020

(65) Prior Publication Data

US 2021/0092315 A1 Mar. 25, 2021

(30) Foreign Application Priority Data

Sep. 23, 2019 (KR) .................. 10-2019-0116880

(51) Int. Cl.
*H04N 5/361* (2011.01)
*H04N 5/378* (2011.01)

(52) U.S. Cl.
CPC ............. *H04N 5/361* (2013.01); *H04N 5/378* (2013.01)

(58) Field of Classification Search
CPC ...... H04N 5/361; H04N 5/378; H04N 5/3698; H04N 5/369; H04N 5/3765; H02M 3/071; H02M 3/073; H02M 3/07; H01L 27/0222; H01L 27/14609; H01L 27/14605; H01L 27/1463
See application file for complete search history.

(56) References Cited

U.S. PATENT DOCUMENTS

| | | | |
|---|---|---|---|
| 6,285,240 B1 * | 9/2001 | Shiau | H02M 3/073 327/536 |
| 6,696,883 B1 | 2/2004 | Wilson | |
| 6,822,298 B2 | 11/2004 | Kaneko et al. | |
| 9,059,630 B2 | 6/2015 | Gueorguiev | |
| 2004/0252211 A1 * | 12/2004 | Rhodes | H04N 5/335 348/308 |
| 2017/0053957 A1 * | 2/2017 | Ueno | H04N 5/378 |
| 2017/0070137 A1 | 3/2017 | Choy et al. | |

(Continued)

FOREIGN PATENT DOCUMENTS

| | | |
|---|---|---|
| JP | 2001-015589 A | 1/2001 |
| JP | 6027330 B2 | 11/2016 |
| KR | 10-0154290 B1 | 12/1998 |

OTHER PUBLICATIONS

Communication dated Feb. 8, 2021 by the European Patent Office in corresponding European Application No. 20197750.1.

*Primary Examiner* — Nhan T Tran
(74) *Attorney, Agent, or Firm* — Sughrue Mion, PLLC

(57) ABSTRACT

A charge pump circuit includes a first pump unit and a second pump unit. The first pump unit includes a first capacitor and a first transistor, and generates a first node voltage by using a clock signal. The second pump unit includes a second capacitor, a second transistor, and a third transistor, and generates a negative output voltage by using the first node voltage. The clock signal and the first node voltage are each toggled between a low-level voltage and a high-level voltage. A magnitude of an absolute value of the negative output voltage is greater than a magnitude of an absolute value of the high-level voltage of the clock signal. A body of the third transistor is electrically isolated from a body of the second transistor.

17 Claims, 21 Drawing Sheets

(56) References Cited

U.S. PATENT DOCUMENTS

2017/0207267 A1* 7/2017 Park .................. H01L 27/14621
2018/0375428 A1   12/2018 Di Gilio
2019/0044438 A1   2/2019 Zou et al.
2020/0145599 A1*  5/2020 Matsuzaki ............. H04N 5/378

* cited by examiner

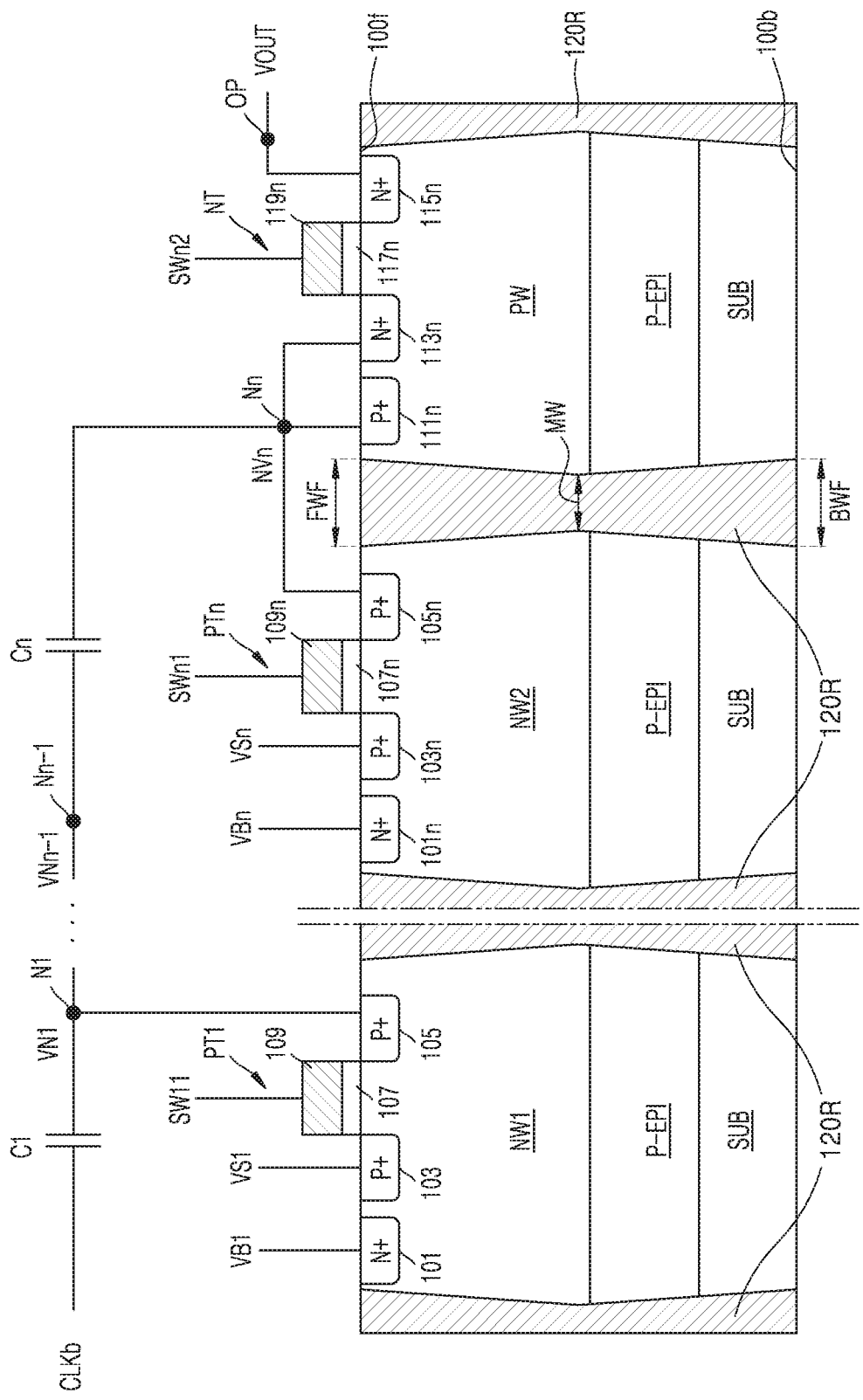

CHARGE PUMP CIRCUIT AND IMAGE SENSOR COMPRISING THE SAME

CROSS-REFERENCE TO RELATED APPLICATION

This application claims priority from Korean Patent Application No. 10-2019-0116880, filed on Sep. 23, 2019, in the Korean Intellectual Property Office, the disclosure of which is incorporated by reference herein in its entirety.

BACKGROUND

1. Field

The present disclosure relates to a charge pump circuit and an image sensor including the charge pump circuit.

2. Description of Related Art

An image sensor, which is a semiconductor-based sensor that accepts light and produces electric signals, may include a pixel array having a plurality of pixels, a circuit configured to drive the pixel array, and the like. Recently, with increasing demand for performance of image sensors, various research has been conducted to improve dark current characteristics of image sensors.

SUMMARY

It is an aspect to provide a charge pump circuit capable of outputting a high negative voltage.

According to an aspect of an example embodiment, there is provided a charge pump circuit comprising a first pump unit comprising a first capacitor and a first transistor, the first pump unit configured to generate a first node voltage by using a clock signal; and a second pump unit comprising a second capacitor, a second transistor, and a third transistor, the second pump unit configured to generate a negative output voltage by using the first node voltage, wherein the clock signal and the first node voltage are each toggled between a low-level voltage and a high-level voltage, a magnitude of an absolute value of the negative output voltage is greater than a magnitude of an absolute value of the high-level voltage of the clock signal, and a body of the third transistor is electrically isolated from a body of the second transistor.

According to another aspect of an example embodiment, there is provided a charge pump circuit configured to generate a negative output voltage by receiving a clock signal, the charge pump circuit comprising a substrate in which a first well and a second well are formed; a first pump unit comprising a first capacitor and a first transistor formed in the first well; a second pump unit comprising a second capacitor and a second transistor formed in the second well; and an isolation layer configured to electrically insulate the first well from the second well, wherein the clock signal is toggled between a low-level voltage and a high-level voltage at a regular period, and a magnitude of an absolute value of the negative output voltage is greater than a magnitude of an absolute value of the high-level voltage.

According to another aspect of an example embodiment, there is provided an image sensor comprising a pixel array comprising a plurality of pixels defined by a first isolation layer; and a charge pump circuit comprising a first pump unit comprising a first capacitor and a first transistor, the first pump unit configured to generate a first node voltage by using a clock signal; and a second pump unit comprising a second capacitor, a second transistor, and a third transistor, the second pump unit configured to generate a negative output voltage by using the first node voltage, and a body of the third transistor is electrically isolated from a body of the second transistor.

According to another aspect of an example embodiment, there is provided a charge pump circuit configured to generate a negative output voltage by receiving a clock signal, the charge pump circuit comprising a substrate in which an epitaxial layer is formed, wherein a first well, a second well, and a third well are formed in the epitaxial layer; a first pump unit comprising a first capacitor and a p-type transistor formed in the first well; a second pump unit comprising a second capacitor, a p-type transistor formed in the second well, and an n-type transistor formed in the third well; and an isolation layer formed between the first well, the second well, and the third well and configured to electrically insulate the first well, the second well, and the third well from one another, wherein the clock signal is toggled between a low-level voltage and a high-level voltage at a regular period, and a magnitude of an absolute value of the negative output voltage is greater than a magnitude of an absolute value of the high-level voltage.

BRIEF DESCRIPTION OF THE DRAWING

Various embodiments will be more clearly understood from the following detailed description taken in conjunction with the accompanying drawings, in which:

FIGS. 6A through 6C are cross-sectional views for describing the charge pump circuit of FIG. 3, according to example embodiments;

DETAILED DESCRIPTION

Figure 1:
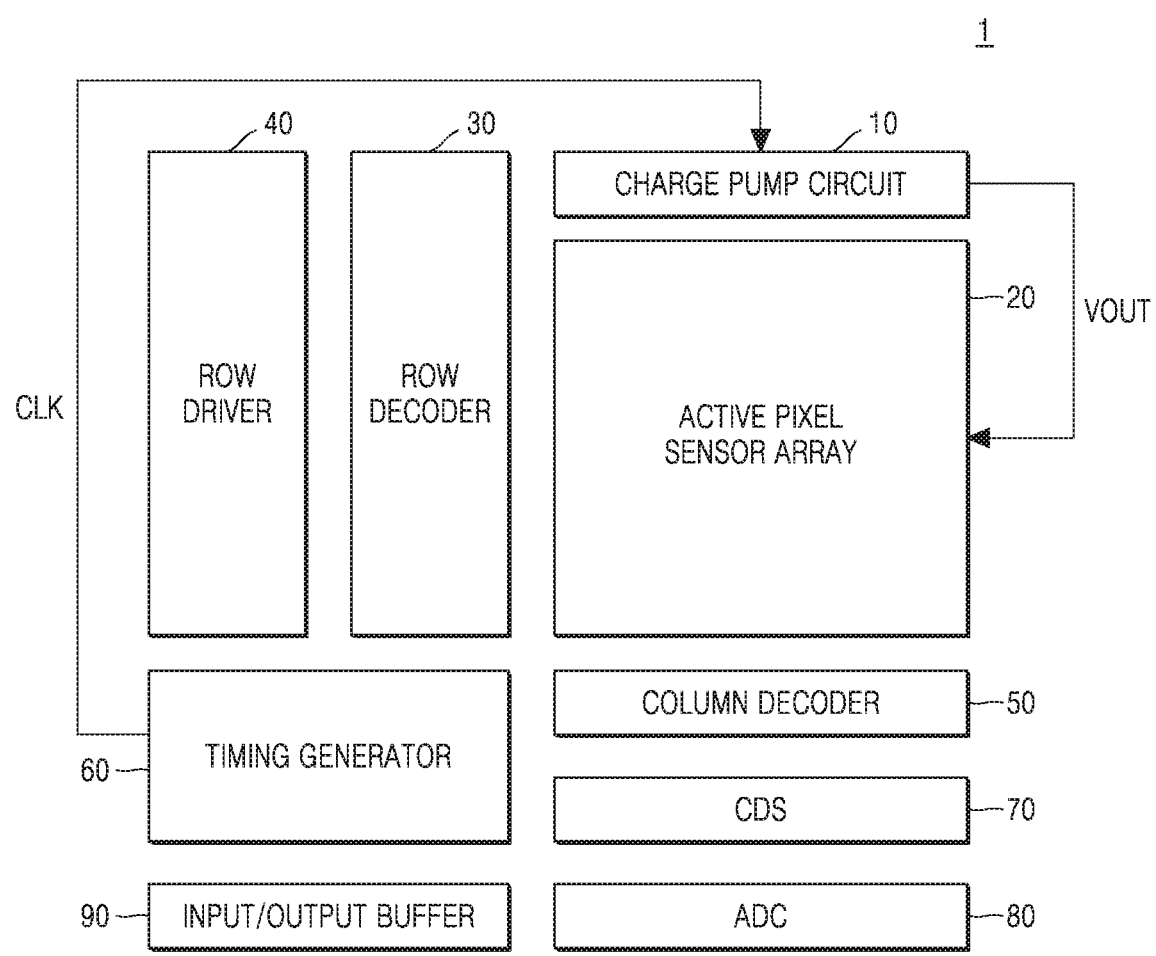
FIG. 1 is a block diagram for describing an image sensor including a charge pump circuit according to an example embodiment.
Figure 2:
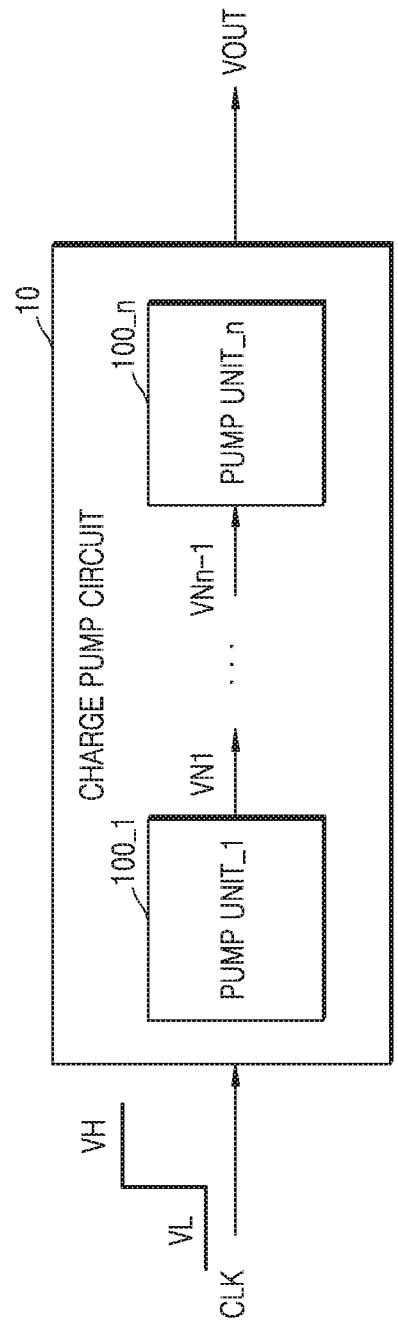
FIG. 2 is a block diagram for describing the charge pump circuit of FIG. 1, according to an example embodiment.

FIG. 1 is a block diagram for describing an image sensor 1 including a charge pump circuit 10 according to an example embodiment. FIG. 2 is a block diagram for describing the charge pump circuit 10 according to an example embodiment.

Referring to FIGS. 1 and 2, the image sensor 1 may include the charge pump circuit 10, an active pixel sensor array 20, a row decoder 30, a row driver 40, a column decoder 50, a timing generator 60, a correlated double sampler (CDS) 70, an analog-digital converter (ADC) 80, and an input/output buffer 90.

The active pixel sensor array 20 may include a plurality of pixels PX (for example, pixels PX in FIG. 13) that are two-dimensionally arranged. The active pixel sensor array 20 may convert an optical signal into an electrical signal. The active pixel sensor array 20 may be driven by a plurality of driving signals provided from the row driver 40, for example, a pixel selecting signal, a reset signal, and a charge transfer signal. The electrical signal converted from the active pixel sensor array 20 may be provided to the CDS 70.

According to a result of the decoding in the row decoder 30, the row driver 40 may provide the plurality of driving signals for driving the plurality of pixels to the active pixel sensor array 20. When the pixels included in the active pixel sensor array 20 are arranged in a matrix, the driving signals may be provided to each row.

The timing generator 60 may provide a timing signal and a control signal to the row decoder 30 and the column decoder 50. According to an example embodiment, the timing generator 60 may provide a clock signal CLK to the charge pump circuit 10.

The CDS 70 may receive, hold, and sample an electrical signal generated in the active pixel sensor array 20. The CDS 70 may perform dual sampling on a certain noise level and a signal level due to the electrical signal, to thereby output a difference level corresponding to a difference between the noise level and the signal level.

The ADC 80 may convert an analog signal, which corresponds to the difference level output from the CDS 70, to a digital signal, and output the digital signal. The input/output buffer 90 latches the digital signal, and the latched signal may sequentially output the digital signal according to a decoding result in the column decoder 50.

The charge pump circuit 10 may receive the clock signal CLK from the timing generator 60 to generate an output voltage VOUT and output the output voltage VOUT to the active pixel sensor array 20. The clock signal CLK may be a signal in which a low-level voltage VL and a high-level voltage VH are each maintained for a certain time period and the low-level voltage VL and the high-level voltage VH periodically and alternately appear. That is, the clock signal CLK may be toggled at regular intervals between the low-level voltage VL and the high-level voltage VH. For example, in some example embodiments, the low-level voltage VL may be a ground voltage, and the high-level voltage VH may be a power voltage.

The output voltage VOUT may be a negative voltage and have a constant magnitude. In an example embodiment, a magnitude of an absolute value of the output voltage VOUT may be greater than a magnitude of an absolute value of the high-level voltage VH. For example, the magnitude of the output voltage VOUT may be equal to or greater than twice a magnitude of the high-level voltage VH. For example, the magnitude of the absolute value of the output voltage VOUT may be n times the magnitude of the absolute value of the high-level voltage VH, for example, n times a power voltage.

The charge pump circuit 10 may include first through nth pump units 100_1 through 100_n. The first through nth pump units 100_1 through 100_n may be connected to one another in series, and the first through nth pump units 100_1 through 100_n may generate negative voltages of which absolute values gradually increase. For example, n may be a natural number equal to or greater than 2. In an example embodiment, n may be a natural number equal to or greater than 3.

The first pump unit 100_1 may output a first node voltage VN1. The first node voltage VN1 may have a same period as that of the clock signal CLK and may be toggled between a low-level voltage lower than the low-level voltage VL of the clock signal CLK, and a high-level voltage lower than the high-level voltage VH of the clock signal CLK.

The nth pump unit 100_n may receive an n-1$^{th}$ node voltage VNn-1 and output the output voltage VOUT that is a negative voltage having a greater absolute value than that of a low-level voltage of the n-1$^{th}$ node voltage VNn-1. In this case, the n-1$^{th}$ node voltage VNn-1 may be a voltage that has a same period as that of the clock signal CLK and changing between a low-level voltage lower than the low-level voltage VL of the clock signal and a high-level voltage lower than the high-level voltage VH of the clock signal CLK. For example, the n-1$^{th}$ node voltage VNn-1 may periodically change between a negative voltage having a magnitude of n-2 times the power voltage and a negative voltage having a magnitude of n-1 times the power voltage.

In an example embodiment, the first pump unit 100_1 may include a capacitor and a transistor, and the n$^{th}$ pump unit 100_n may include a capacitor and a plurality of transistors. In an example embodiment, a well in which the transistor of the first pump unit 100_1 is formed and wells in which the transistors of the n$^{th}$ pump unit 100_n are formed may be electrically insulated from one another. In some example embodiments, different wells, in which the transistors included in the n$^{th}$ pump unit 100_n are formed, may be electrically insulated from one another.

To reduce a dark current of the image sensor 1, the output voltage VOUT may be provided to an isolation layer of the active pixel sensor array 20. The charge pump circuit 10 may include the first through n$^{th}$ pump units 100_1 through 100_n, and the first through n$^{th}$ pump units 100_1 through 100_n may respectively generate negative voltages of which absolute values gradually increase. Accordingly, the image sensor 1 may apply a high voltage to the isolation layer of the active pixel sensor array 20, and dark current characteristics of the image sensor 1 may be improved. In descriptions of FIGS. 14A through 14C and the like, an example embodiment of providing the output voltage VOUT to the isolation layer of the active pixel sensor array 20 will be described.

The output voltage VOUT may be provided to a gate of a transmitting transistor of each of the plurality of pixels of the active pixel sensor array 20. The image sensor 1 may provide a high negative voltage to the gate of the transmitting transistor to increase a potential of the gate of the transmitting transistor and increase a full-well capacitance (FWC) of the photoelectric conversion element of each of the plurality of pixels. Alternatively, the output voltage VOUT may be provided to a gate of a resetting transistor of each of the plurality of pixels of the active pixel sensor array 20. The image sensor 1 may provide a high negative voltage to the gate of the resetting transistor to increase a potential of the gate of the resetting transistor and increase an FWC of the floating diffusion region of each of the plurality of pixels. In the description of FIG. 15 and the like, an example embodiment of providing the output voltage VOUT to the pixels PX of the active pixel sensor array 20 will be described later.

Figure 3:
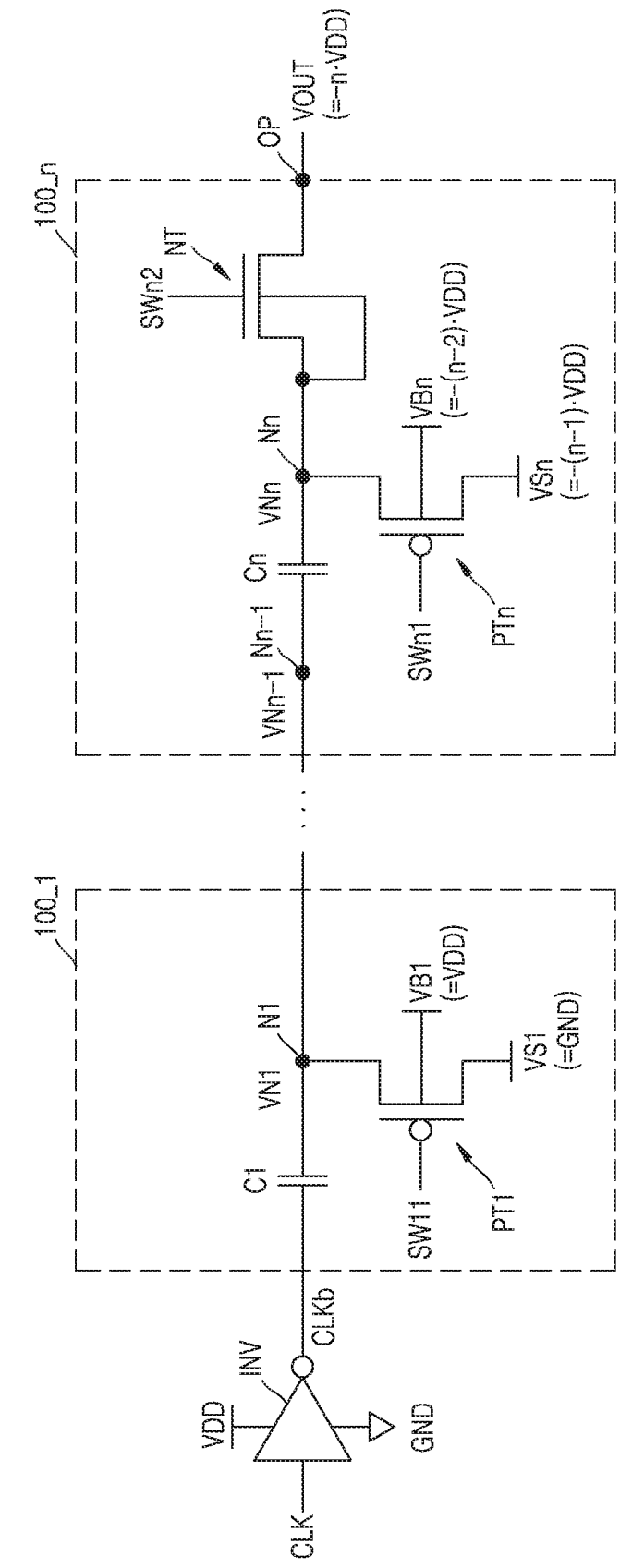
FIG. 3 is a circuit diagram for describing the charge pump circuit of FIG. 2, according to an example embodiment.
Figure 4:
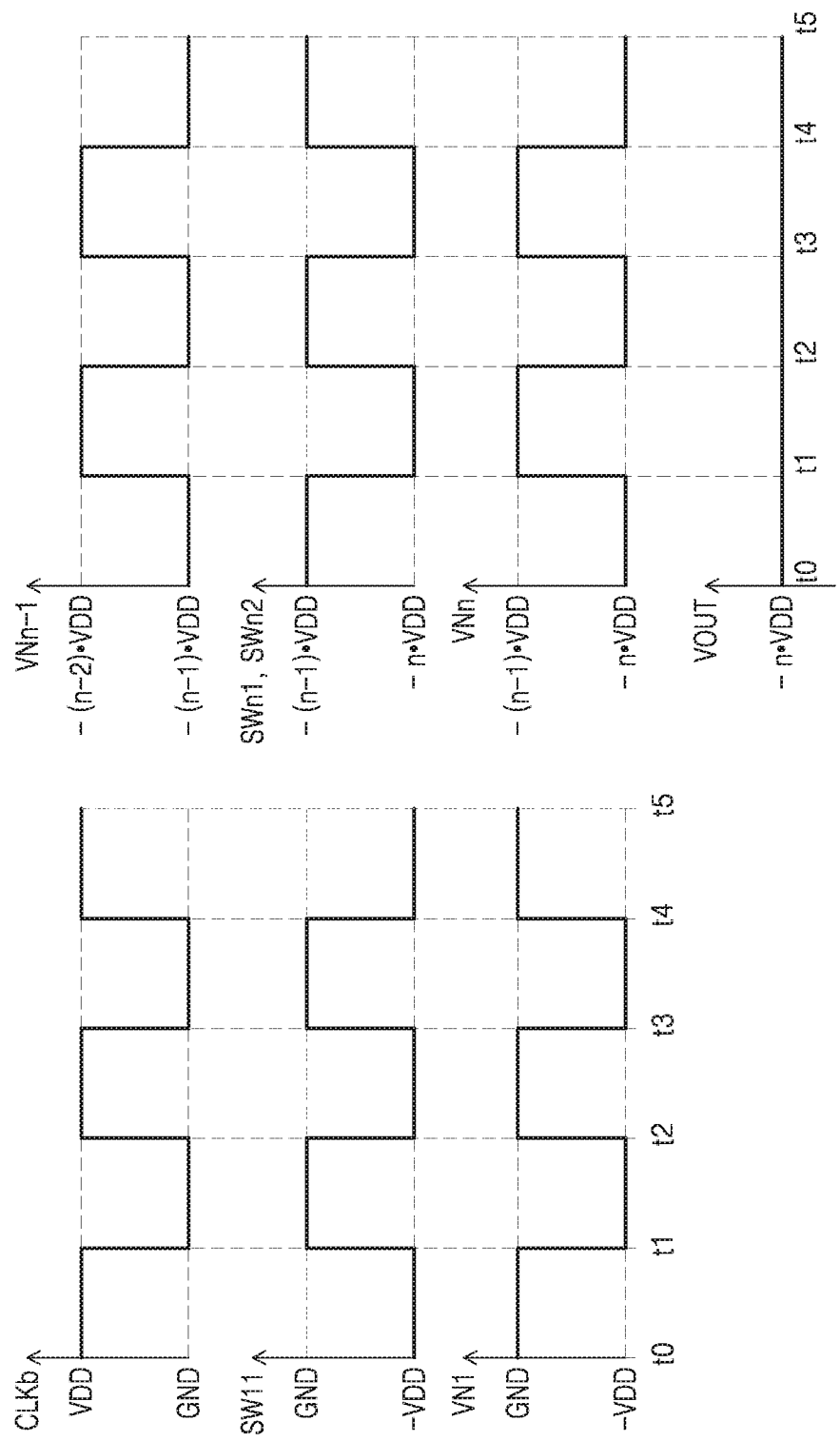
FIG. 4 is a graph for describing operations of the charge pump circuit of FIG. 3, according to an example embodiment.

FIG. 3 is a circuit diagram for describing the charge pump circuit 10 according to an example embodiment. FIG. 4 is a graph for describing operations of the charge pump circuit 10 according to an example embodiment.

Referring to FIG. 3, the charge pump circuit 10 may include an inverter INT and the first through $n^{th}$ pump units 100_1 through 100_$n$. Here, n may be a natural number equal to or greater than 2. The first through nth pump units 100_1 through 100_$n$ may each include a capacitor and a transistor configured to accumulate an electric charge.

The inverter INV may invert the clock signal CLK to output a clock inversion signal CLKb. The ground voltage GND and the power voltage VDD may be applied to the inverter INV as operation voltages. Although FIG. 3 shows that the charge pump circuit 10 includes the inverter INT, in some example embodiments the charge pump circuit 10 may omit the inverter INT. A clock signal CLK may be a signal that periodically changes between the ground voltage GND and the power voltage VDD.

The first pump unit 100_1 may include a first capacitor C1 and a first p-type transistor PT1. A first terminal of the first capacitor C1 may be connected to the inverter INT, and a second terminal of the first capacitor C1 may be connected to a first node N1.

A drain of the first p-type transistor PT1 may be connected to the first node N1, and a first source voltage VS1 may be applied to a source of the first p-type transistor PT1. For example, the first source voltage VS1 may be the ground voltage GND.

A first body voltage VB1 may be applied to a body of the first p-type transistor PT1. For example, the first body voltage VB1 may be the power voltage VDD. A switch signal SW11 may be provided as a control signal to a gate of the first p-type transistor PT1.

The $n^{th}$ pump unit 100_$n$ may include an $n^{th}$ capacitor Cn, an $n^{th}$ p-type transistor PTn, and an N-type transistor NT. A first terminal of the nth capacitor Cn may be connected to an N-1$^{th}$ node Nn-1, and a second terminal of the $n^{th}$ capacitor Cn may be connected to an $n^{th}$ node Nn. For example, when n is 2, a first terminal of the $n^{th}$ capacitor Cn may be connected to the first node N1.

A drain of the $n^{th}$ P-type transistor PTn may be connected to the $n^{th}$ node Nn, and an $n^{th}$ source voltage VSn may be applied to a source of the $n^{th}$ P-type transistor PTn. For example, the $n^{th}$ source voltage VSn may be a negative voltage having a magnitude of n-1 times the absolute value of the power voltage VDD.

An $n^{th}$ body voltage VBn may be applied to a body of the $n^{th}$ P-type transistor PTn. For example, the $n^{th}$ body voltage VBn may be a negative voltage having a magnitude of n-2 times the absolute value of the power voltage VDD. A switch signal SWn1 may be provided as a control signal to a gate of the $n^{th}$ P-type transistor PTn.

A drain of the N-type transistor NT may be connected to the $n^{th}$ node Nn, and a body of the N-type transistor NT may be connected to the $n^{th}$ node Nn. A switch signal SWn2 may be provided as a control signal to a gate of the N-type transistor NT. A source of the N-type transistor NT may be connected to an output terminal OP and output the output voltage VOUT in response to the switch signal SWn2.

Referring to FIGS. 3 and 4, a clock inversion signal CLKb may be a signal that periodically changes between the power voltage VDD and the ground voltage GND. For example, the clock inversion signal CLKb may maintain the power voltage VDD from a reference time t0 to a first time t1, from a second time t2 to a third time t2, and from a fourth time t4 to a fifth time t5. The clock inversion signal CLKb may maintain the ground voltage GND from the first time t1 to the second time t2 and from the third time t3 to the fourth time t4.

Here, the first through fifth times t1, t2, t3, t4, and t5 may be times sequentially arriving after the reference time t0. Differences between adjacent times in a time series may be constant, but example embodiments are not limited thereto. For example, a time difference between the reference time t0 and the first time t1, where the clock inversion signal CLKb maintains the power voltage VDD, may be greater or less than a time difference between the first time t1 and the second time t2, where the clock inversion signal CLKb maintains the ground voltage GND. In other words, in some example embodiments, a duty cycle of the clock inversion signal CLKb may be different than that shown in FIG. 4.

According to an example embodiment, when the clock inversion signal CLKb is the power voltage VDD, the switch signal SW11 controlling the first P-type transistor PT1 may be a first negative voltage −VDD having a same magnitude as that of the power voltage VDD. The first P-type transistor PT1 may be turned on in response to the switch signal SW11, and the first node voltage VN1 of the first node N1 may be substantially identical to the ground voltage GND that is the first source voltage VS1. Accordingly, a potential difference between a first terminal and a second terminal of a first capacitor C1 may be substantially identical to the power voltage VDD.

According to an example embodiment, when the clock inversion signal CLKb is the ground voltage GND, the switch signal controlling the first P-type transistor PT1 may be the ground voltage GND. The first P-type transistor PT1 may be turned off in response to the switch signal SW11. As voltages at two terminals of the first capacitor C1 continuously change, the potential difference between the first terminal and the second terminal of the first capacitor C1 may maintain the power voltage VDD. Accordingly, the first node voltage VN1 may be the first negative voltage −VDD having a same magnitude as that of the power voltage VDD.

Accordingly, the first pump unit 100_1 may receive the clock inversion signal CLKb, which periodically changes between the power voltage VDD and the ground voltage GND, and output the first node voltage VN1 that periodically changes between the ground voltage GND and the first negative voltage −VDD. For example, the first through $n^{th}$ pump units 100_1 through 100_$n$ may each output a voltage reduced by the magnitude of the power voltage VDD than a received voltage. The (n−1)$^{th}$ node voltage VNn-1 of the n-1$^{th}$ node Nn-1 may be a voltage that periodically changes between an (n−2)$^{th}$ negative voltage −(n−2)·VDD having a magnitude of (n−2) times the power voltage VDD and an (n−1)$^{th}$ negative voltage −(n−1)·VDD having a magnitude of (n−1) times the power voltage VDD. However, when n is 2, the (n−2)$^{th}$ negative voltage −(n−2)·VDD may not be a negative voltage but the ground voltage GND, and when n is equal to or greater than 3, the n-2$^{th}$ negative voltage −(n−2)·VDD may be a negative voltage.

According to an example embodiment, when the clock inversion signal CLKb is the power voltage VDD, the switch signal SWn1 controlling the n$^{th}$ P-type transistor PTn may be the (n−1)$^{th}$ negative voltage −(n−1)·VDD having a magnitude of n−1 times the power voltage VDD. The n$^{th}$ P-type transistor PTn may be turned on in response to the switch signal SWn1, and the n$^{th}$ node voltage VNn of the n$^{th}$ node Nn may be substantially identical to the (n−1)$^{th}$ negative voltage −(n−1)·VDD that is the n$^{th}$ source voltage VSn. Accordingly, the potential difference between the first terminal and the second terminal of the first capacitor C1 may be substantially identical to the power voltage VDD.

A switch signal SWn2 controlling an N-type transistor NT may be substantially identical to the switch signal SWn1 controlling the n$^{th}$ P-type transistor PTn. Accordingly, when the clock inversion signal CLKb is the power voltage VDD, the switch signal SWn2 controlling the N-type transistor NT may be the (n−1)$^{th}$ negative voltage −(n−1)·VDD, and the N-type transistor NT may be turned off. The n$^{th}$ node Nn and the output terminal OP may not be connected to each other.

According to an example embodiment, when the clock inversion signal CLKb is the ground voltage in FIG. 4, the switch signal SWn1 controlling the n$^{th}$ P-type transistor PTn may be the n$^{th}$ negative voltage −n·VDD having a magnitude of n times the power voltage VDD. The n$^{th}$ P-type transistor PTn may be turned off in response to the switch signal SWn. As voltages at the two terminals of the nth capacitor Cn continuously change, a potential difference between the first terminal and the second terminal of the n$^{th}$ capacitor Cn may maintain the power voltage VDD. Accordingly, the n$^{th}$ node voltage VNn may be an n$^{th}$ negative voltage −n·VDD.

When the clock inversion signal CLKb is the ground voltage in FIG. 4, the switch signal SWn2 controlling the N-type transistor NT may be the n$^{th}$ negative voltage −n·VDD. The N-type transistor NT may be turned on, and the n$^{th}$ node voltage VNn may be output as an output voltage VOUT from the output terminal of the n$^{th}$ pump unit 100_n.

The configuration of the charge pump circuit 10 shown in FIG. 3 is merely an example, and example embodiments are not limited thereto. The charge pump circuit 10 configured to accumulate a charge to output a negative voltage may be variously embodied. In addition, only the circuit in which the first through n$^{th}$ pump units 100_1 through 100_n generate the output voltage VOUT by using the clock inversion signal CLKb is described with reference to FIG. 3, but example embodiments are not limited to the described circuit. For example, in some example embodiments, the charge pump circuit 10 may further include a complementary circuit that is connected to the output terminal OP and generates the output voltage of the nth negative voltage −n·VDD by using a re-inverted signal of the clock inversion signal CLKb when the clock inversion signal CLKb is the power voltage VDD. The complementary circuit according to an example embodiment will be described later with reference to FIG. 7 and the like.

The charge pump circuit 10 is configured such that the first through n$^{th}$ pup units 100_1 through 100_n are electrically insulated from one another, and thus, the number of pump units included in the charge pump circuit 10 may increase. Accordingly, the magnitude of the output voltage VOUT increases in proportion to the number of pump units, and therefore, the charge pump circuit 10 may generate a high negative voltage.

Figure 5:
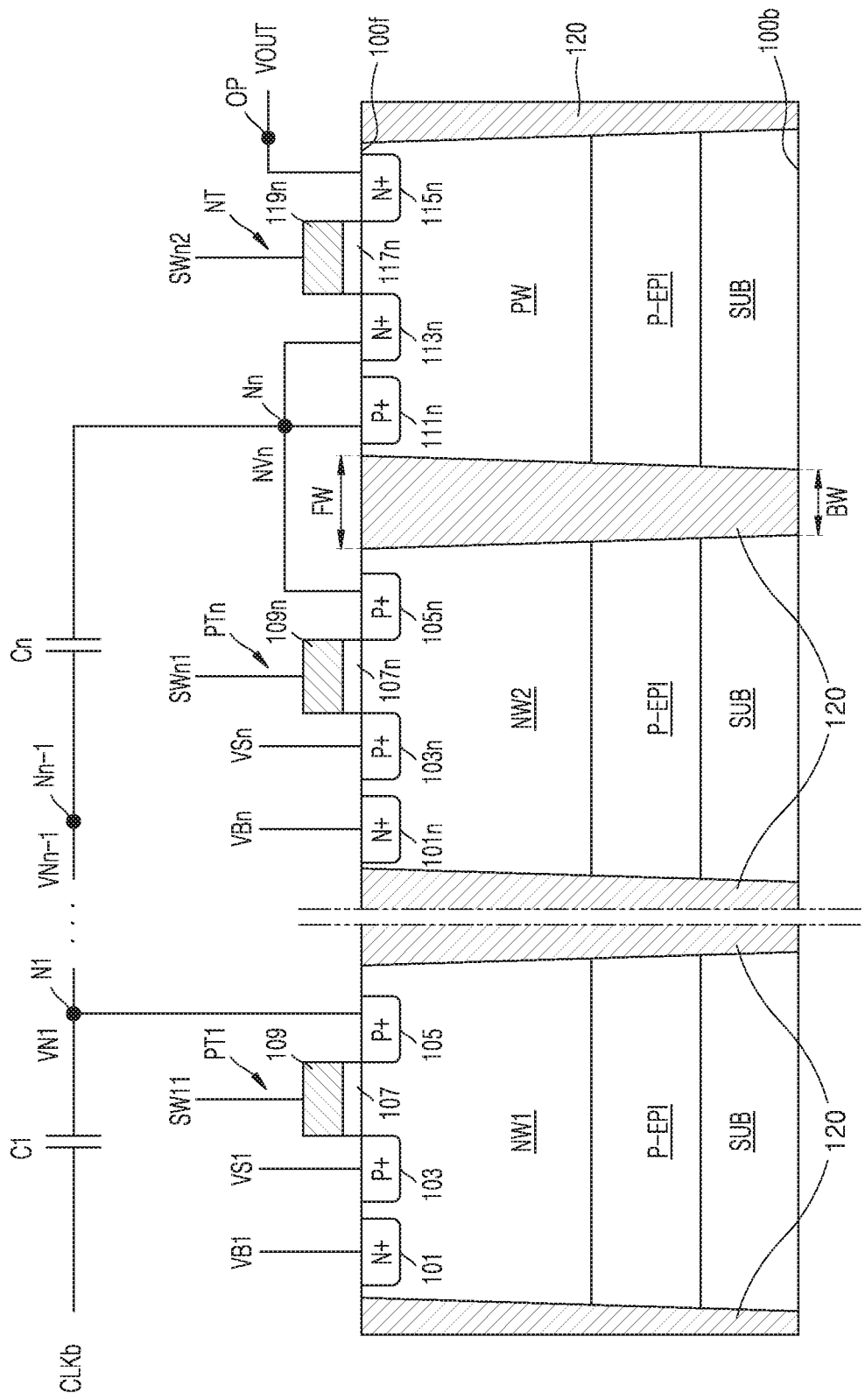
FIG. 5 is a cross-sectional view for describing the charge pump circuit of FIG. 3, according to an example embodiment.

FIG. 5 is a cross-sectional view for describing the charge pump circuit 10 according to an example embodiment. FIG. 5 is a view of the charge pump circuit 10 shown in FIG. 3, only excluding the inverter INV for conciseness.

Referring to FIG. 5, the charge pump circuit 10 may include a substrate SUB, an epitaxial layer P-EPI formed in the substrate SUB, and wells NW1, NW2, and PW formed in the epitaxial layer P-EPI. It is noted that the lines shown in FIG. 5 between the substrate SUB, the epitaxial layer P-EPI and the wells NW1, NW2, PW are for convenience of description and illustration. The wells NW1, NW2 and PW may include an N-well doped with an N-type impurity and a P-well doped with a P-type impurity. For example, a first well NW1 and a second NW2 may be N wells doped with the N-type impurity, and a third well PW may be a P well doped with the P-type impurity.

According to an example embodiment, the substrate SUB may be any one of a bulk silicon substrate, a silicon-on-insulator (SOI) substrate, a germanium substrate, a germanium-on-insulator (GOI) insulator, or a silicon-germanium substrate, but example embodiments are not limited thereto. According to an example embodiment, the substrate SUB may include at least one of silicon (Si), germanium (Ge), silicon-germanium (SiGe), gallium-arsenic (GaAs), indium-gallium-arsenic (InGaAs), aluminum-gallium-arsenic (Al-GaAs), or a combination thereof. In this specification, the phrase "at least one of A or B" includes "only A", "only B", and "both A and B".

According to an example embodiment, the substrate SUB may be a doped semiconductor layer. According to an example embodiment, the substrate SUB may be doped with a P-type impurity but example embodiments are not limited thereto.

The substrate SUB may include a first surface 100f and a second surface 100b that face each other. The first surface 100f of the substrate SUB may be a front surface of the substrate SUB, and the second surface 100b of the substrate SUB may be a back surface of the substrate SUB.

According to an example embodiment, the epitaxial layer P-EPI may be a semiconductor material layer formed due to selective epitaxial growth. According to an example embodiment, the epitaxial layer P-EPI may be doped with a P-type impurity and doped at a higher concentration than a concentration of the substrate SUB, but example embodiments are not limited thereto. In some example embodiments, the epitaxial layer P-EPI may be omitted. Accordingly, the wells NW1, NW2, and PW may be formed in the substrate SUB, and the substrate SUB may be doped with a highly concentrated P-type impurity.

The first P-type transistor PT1 may be formed in the first well NW1. A first P-type region 103, a second P-type region 105, and an N-type region 101, which are formed in the first well NW1, and a gate insulating layer 107 and a gate electrode 109 formed above the first well NWT may construct the first P-type transistor PT1. The gate insulating layer 107 may be formed between the first well NW1 and the gate electrode 109.

The first P-type region 103 and the second P-type region 105, which are formed in the first well NW1, may constitute different electrodes of the first P-type transistor PT1 and may be a source and a drain, respectively. For example, the first source voltage VS1 may be applied to the first P-type region 103, and the second P-type region 105 may be connected to the first node N1 and receive the first node voltage VN1, as illustrated in the example of FIG. 5. The switch signal SW11 may be applied to the gate electrode 109.

The N-type region 101 formed in the first well NW1 may be a contact region to apply a voltage to the body of the first P-type transistor PT1. For example, the first body voltage VB1 may be applied to the first well NW1 through the N-type region 101.

The $n^{th}$ P-type transistor PTn may be formed in the second well NW2. A first P-type region 103n, a second P-type region 105n, and an N-type region 101n, which are formed in the second well NW2, and a gate insulating layer 107 and a gate electrode 109 formed above the second well NW2, may construct the $n^{th}$ P-type transistor PTn. The gate insulating layer 107n may be formed between the second well NW2 and the gate electrode 109n.

The first P-type region 103n and the second P-type region 105n, which are formed in the second well NW2, may constitute different electrodes of the $n^{th}$ P-type transistor and may be a source and a drain, respectively. For example, the $n^{th}$ source voltage VSn may be applied to the first P-type region 103n, and the second P-type region 105n may be connected to the $n^{th}$ node Nn and receive the $n^{th}$ node voltage VNn, as illustrated in the example of FIG. 5. The switch signal SWn1 may be applied to the gate electrode 109n.

The N-type region 101n formed in the second well NW2 may be a contact region for applying a voltage to the body of the $n^{th}$ P-type transistor PTn. For example, the $n^{th}$ body voltage VBn may be applied to the second well NW2 through the N-type region 101n.

The N-type transistor NT may be formed in the third well PW. A first N-type region 113n, a second N-type region 115n, and a P-type region 111n, which are formed in the third well, and a gate insulating layer 117n and a gate electrode 119n formed above the third well PW may construct the N-type transistor NT. The gate insulating layer 117n may be formed between the third well PW and the gate electrode 119n.

The first N-type region 113n and the second N-type region 115n formed in the third well PW may constitute different electrodes of the N-type transistor NT and may be a source and a drain, respectively. The first N-type region 113n may be connected to the nth node Nn, and the $n^{th}$ node voltage VNn may be applied to the first N-type region 113n. The second N-type region 115n may be connected to the output terminal OP. The switch signal SWn2 may be applied to the gate electrode 119n.

The P-type region 111n formed in the third well PW may be a contact region for applying a voltage to the body of the N-type transistor NT. For example, through the P-type region 111n, the third well PW may be connected to the $n^{th}$ node Nn and the $n^{th}$ node voltage VNn may be applied to the third well PW.

According to an example embodiment, the P-type regions, that is, the first P-type region 103, the second P-type region 105, the first P-type region 103n, the second P-type region 105n, and the P-type region 111n, may be regions doped at a high concentration with the P-type impurity, and the N-type regions, that is, the N-type region 101, the N-type region 101n, the N-type region 113n and the N-type region 115n, may be regions doped at a high concentration with the N-type impurity.

According to an example embodiment, the first through $n^{th}$ capacitors C1 through Cn may be formed at a same level as the line layers formed by the back end of line (BEOL) process and/or the front end of line (FEOL) process. According to an example embodiment, the first through $n^{th}$ capacitors C1 through Cn may be formed by the BEOL process and/or the FEOL process.

The isolation layer 120 may be formed between the first well NW1, the second well NW2, and the third well PW, to which different voltages are respectively applied. In other words, the isolation layer 120 is formed between the first well NW1 and the second well NW2, and between the second well NW2 and the third well PW. The isolation layer 120 may be formed to surround each of the first well NW1, the second well NW2, and the third well PW. In an example embodiment, the isolation layer 120 may include an insulating material. However, the isolation layer 120 may include silicon oxide but example embodiments are not limited thereto, and insulating materials constructing the isolation layer 120 may be variously modified.

In an example embodiment, the isolation layer 120 may extend from the first surface 100f of the substrate SUB to the second surface 100b of the substrate 100b. In an example embodiment, a width of a cross-section of the isolation layer 120 may decrease away from the first surface 100f of the substrate SUB and toward the second surface 100b of the substrate SUB. In other words, a width of the cross-section of the isolation layer 120 may decrease as a distance from the first surface 100f of the substrate SUB increases. For example, in the isolation layer 120, a first width FW of a surface contacting the first surface 100f may be greater than a second width BW of a surface contacting the second surface 100b. In an example embodiment, the isolation layer 120 may be formed by etching a portion of the substrate SUB in a vertical direction from the first surface 100f of the substrate SUB and filling an insulating material in the etched portion. (It should be noted that the break in the isolation layer 120 between the first well NW1 and the second well NW2 is intended to illustrate that there may be more than two charge pump units (i.e., n may be more than 2 as described above) and thus corresponds to the ellipsis in the CLKb line shown at the top of FIG. 5 for convenience.)

In the charge pump circuit according to various example embodiments, the plurality of transistors in which different voltages are respectively applied to bodies are respectively formed in different wells, and the different wells may be isolated from one another by using the isolation layer 120. The isolation layer 120 may prevent junction breakdown that may occur due to a difference between voltages that are respectively applied to different wells. For example, junction breakdown between the second well NW2 and the third well PW that may occur due to a difference between the $n^{th}$ body voltage VBn and the $n^{th}$ node voltage VNn respectively applied to the second well NW2 and the third well PW may be prevented. Accordingly, the number of pump units that are included in the charge pump circuit and connected to one another in series may increase, and the charge pump circuit may produce a high negative voltage.

Figure 6A:
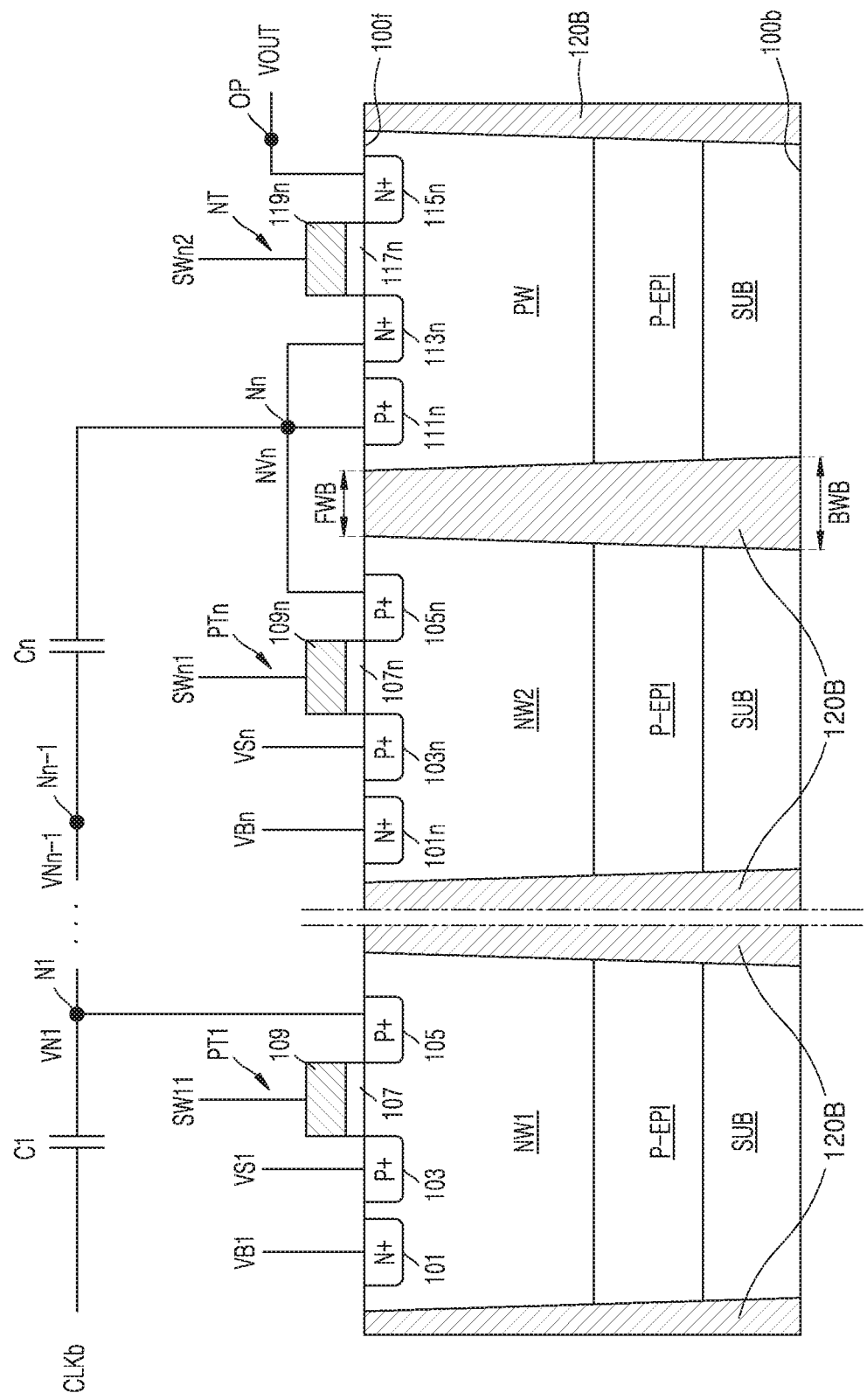
Figure 6C:
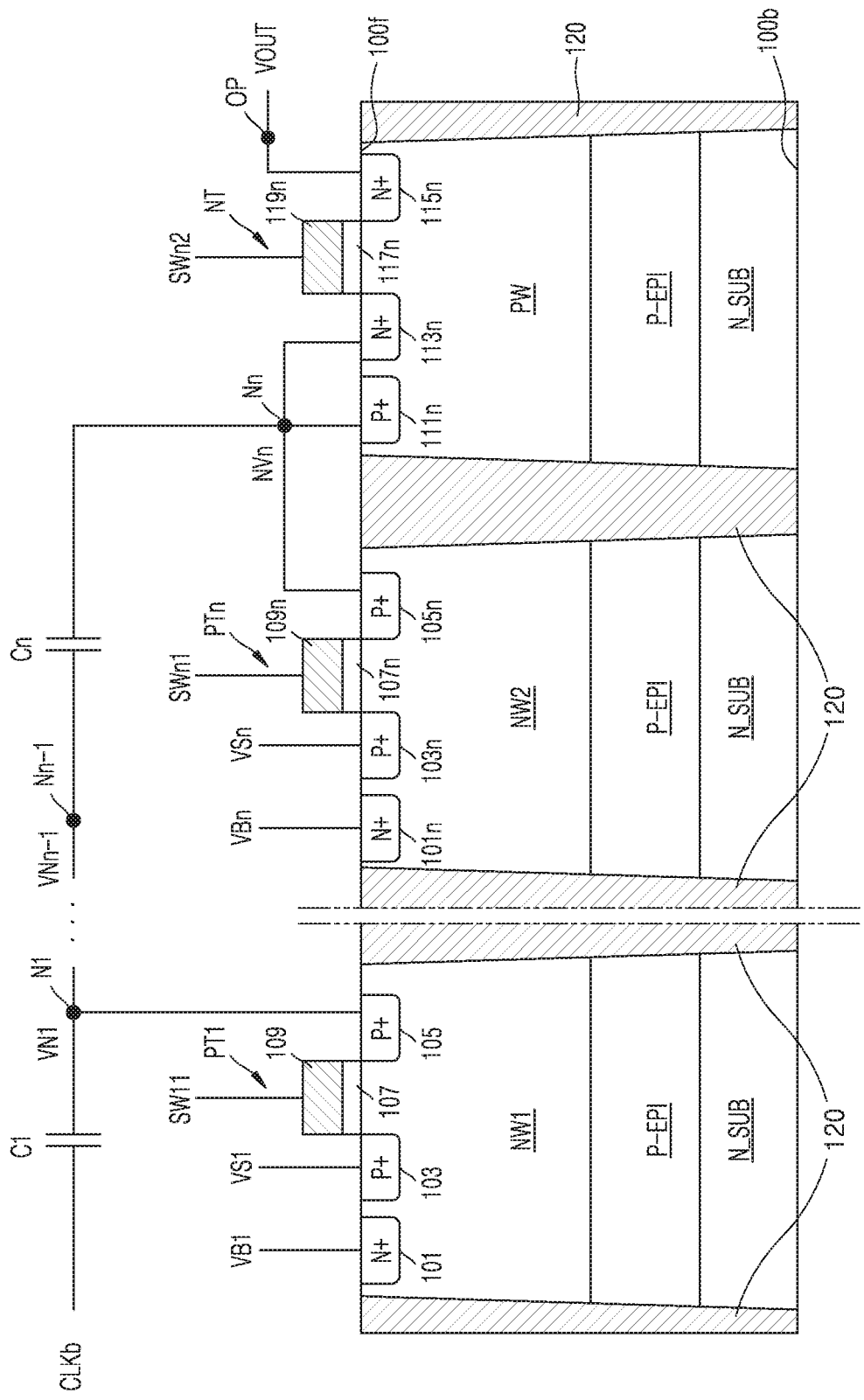

FIGS. 6A through 6C are cross-sectional views for describing the charge pump apparatus 10 according to example embodiments. FIGS. 6A through 6C are views of the charge pump circuit 10 shown in FIG. 3, only excluding the inverter INV. In descriptions regarding FIGS. 6A through 6C, description will not be repeatedly given for the same reference numerals as those of FIG. 5 for conciseness.

Referring to FIG. 6A, an isolation layer 120B may be formed between the first well NW1, the second well NW2, and the third well PW. The isolation layer 120B may be formed to surround each of the first well NW1, the second well NW2, and the third well PW. In an example embodiment, the isolation layer 120B may include an insulating material.

In an example embodiment, a width of a cross-section of the isolation layer 120B may increase away from the first surface 100f of the substrate SUB and toward the second surface 100b of the substrate SUB. In other words, the width of the cross-section of the isolation layer 120B may increase as a distance from the first surface 100f of the substrate SUB increases. For example, in the isolation layer 120B, a first width FWB of a surface contacting the first surface 100f may be less than a second width BWB of a surface contacting the second surface 100b. In an example embodiment, the isolation layer 120B may be formed by etching a portion of the substrate SUB in a vertical direction from the second surface 100B of the substrate SUB and filling an insulating material in the etched portion.

Referring to FIG. 6B, an isolation layer 120R may be formed between the first well NW1, the second well NW2, and the third well PW. The isolation layer 120R may be formed to surround the first well NW1, the second well NW2, and the third well PW In an example embodiment, the isolation layer 120R may include an insulating layer.

In an example embodiment, a width of a cross-section of the isolation layer 120R may decrease from the first surface 100f toward a center of the substrate SUB and may decrease from the second surface 100b of the substrate SUB toward the center of the substrate SUB. In other words, the width of the cross-section of the isolation layer 120R may decrease as a distance from the first surface 100f of the substrate SUB increases, and may decrease as a distance from the second surface 100b of the substrate SUB increases. For example, in the isolation layer 120B, a first width FWF of a surface contacting the first surface 100f may be greater than a third width MW of a cross-section of the center of the isolation layer 120R, and a second width BWF of a surface contacting the second surface 100b may be greater than the third width MW. In an example embodiment, the isolation layer 120R may be formed by etching a portion of the substrate SUB in a vertical direction from the first surface 100f of the substrate, etching another portion of the substrate SUB in the vertical direction from the second surface 100b of the substrate SUB, and then filling an insulating material in the etched portions. Alternatively, in another example embodiment, the isolation layer 120R may be formed by etching a portion of the substrate SUB in the vertical direction from the second surface 100b of the substrate SUB, etching another portion of the substrate SUB in the vertical direction from the first surface 100f of the substrate SUB, and filling an insulating material in the etched portions.

Referring to FIG. 6C, a substrate N_SUB may be doped with the N-type impurity. In some example embodiments, the epitaxial layer P-EPI may be omitted. Accordingly, the first and second wells NW1, NW2, and the third well PW may be formed in the substrate N_SUB.

Figure 7:
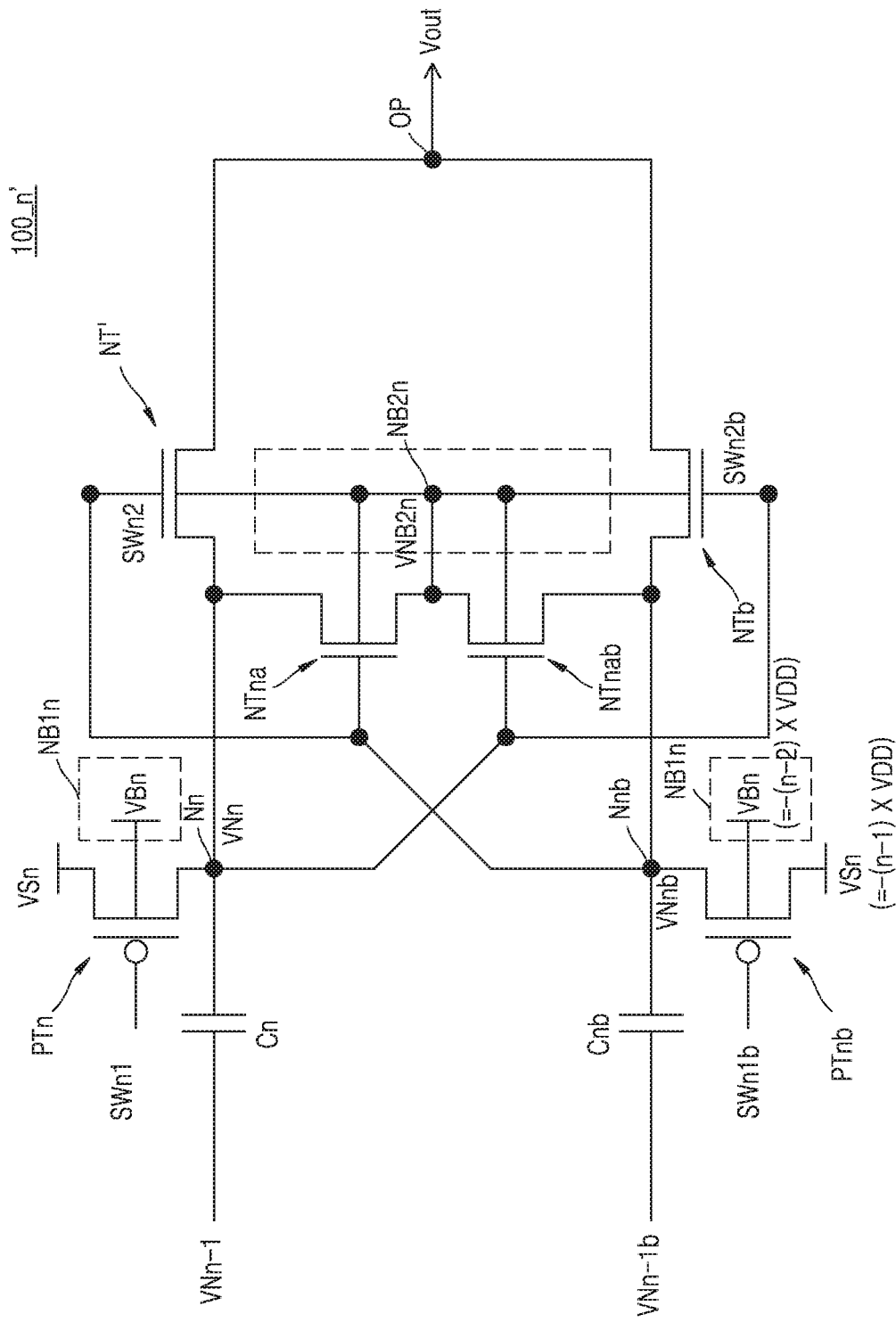
FIG. 7 is a circuit diagram for describing a charge pump circuit according to an example embodiment.
Figure 8:
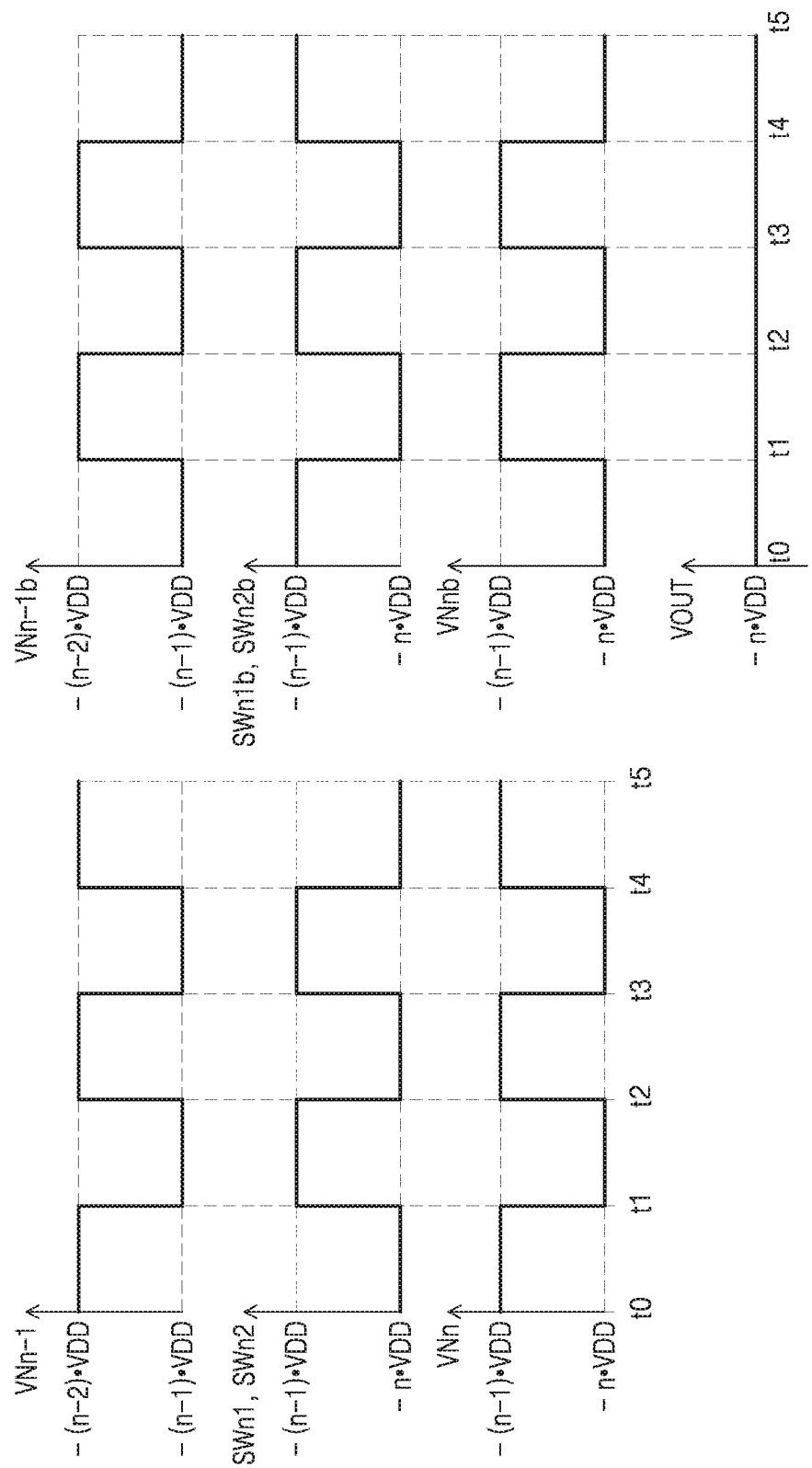
FIG. 8 is a graph for describing operations of the charge pump circuit of FIG. 7, according to an example embodiment.

FIG. 7 is a circuit diagram for describing a charge pump circuit according to an example embodiment. FIG. 8 is a graph for describing operations of the charge pump circuit of FIG. 7 according to an example embodiment. In the descriptions regarding FIGS. 7 and 8, descriptions will not be repeated for the same reference numerals as those of FIGS. 3 and 4, respectively, for conciseness.

Referring to FIG. 7, an $n^{th}$ pump unit 100_n' of the charge pump circuit 10 may include the $n^{th}$ capacitor Cn, the $n^{th}$ P-type transistor PTn, and an N-type transistor NT', and may additionally include a capacitor Cnb, a first transistor PTnb that is a P-type transistor, and a second transistor NTb, a third transistor NTnab, and a fourth transistor NTna that are N-type transistors.

A drain of the N-type transistor NT' may be connected to the $n^{th}$ node Nn, and a body of the N-type transistor NT' may be connected to the $n^{th}$ node Nn through the fourth transistor NTna. For example, the body of the N-type transistor NT' may be connected to a second body node NB2n; a first electrode of the fourth transistor NTna may be connected to the $n^{th}$ node Nn; and a second electrode of the fourth transistor NTna may be connected to the second body node NB2n. The switch signal SWn2 input to the gate of the N-type transistor NT' may be provided as a control signal to a gate of the fourth transistor NTna, and the fourth transistor NTna may electrically connect the $n^{th}$ node Nn to the second body node NB2n in response to the switch signal SWn2.

Compared to the $n^{th}$ pump unit 100_n shown in FIG. 3, the $n^{th}$ pump unit 100_n' shown in FIG. 7 may further include a complementary circuit. The complementary circuit may include the capacitor Cnb, the first transistor PTnb, a second transistor NTb, and a third transistor NTnab.

A complementary voltage VNn-1b of the $(n-1)^{th}$ node voltage VNn-1 may be input to an end of the capacitor Cnb of the complementary circuit. The other end of the capacitor Cnb of the complementary circuit may be connected to a sub node Nnb. In an example embodiment, the gate of the N-type transistor NT' and the gate of the fourth transistor NTna may be connected to the sub node Nnb. Accordingly, the switch signal SWn2 applied to the gate of the N-type transistor NT' may be a sub-node voltage VNnb of the sub node Nnb.

A drain of the first transistor PTnb of the complementary circuit may be connected to the sub node Nnb, and the $n^{th}$ source voltage VSn may be applied to the source of the first transistor PTnb of the complementary circuit. For example, the $n^{th}$ source voltage VSn may be a negative voltage having a magnitude of n-1 times the absolute value of the power voltage VDD.

The $n^{th}$ body voltage VBn may be applied to a body of the first transistor PTnb of the complementary circuit. For example, the $n^{th}$ body voltage VBn may be a negative voltage having a magnitude of n-2 times the absolute value of the power voltage VDD. In other words, a same voltage may be applied to the body of the first transistor PTnb and the body of the $n^{th}$ P-type transistor PTn of the complementary circuit, and in an example embodiment, the body of the first transistor PTnb and the body of the $n^{th}$ P-type transistor PTn of the complementary circuit may be connected to a first body node NB1n.

A switch signal SWn1b may be provided as a control signal to the gate of the first transistor PTnb of the complementary circuit. The switch signal SWn1b applied to the gate of the first transistor PTnb of the complementary circuit and the switch signal SWn1 input to the gate of the $n^{th}$ P-type transistor PTn may be complementary.

A source of the second transistor NTb of the complementary circuit may be connected to the output circuit OP and output the output voltage VOUT in response to the switch signal SWn2b. A gate of the second transistor NTb may be connected to the $n^{th}$ node Nn, and the switch signal SWn2b input to the gate of the second transistor NTb may be the $n^{th}$ node voltage VNn.

A drain of the second transistor NTb may be connected to the sub node Nnb, and a body of the second transistor NTb may be connected to the sub node Nnb through the third transistor NTnab.

For example, a body of the third transistor NTnab may be connected to a second body node NB2n; a first electrode of the third transistor NTnab may be connected to the sub node Nnb; and a second electrode of the third transistor NTnab may be connected to the second body node NB2n. The switch signal SWn2b may be provided as a control signal to a gate of the third transistor NTnab, and in response to the switch signal SWn2b, the sub node Nnb and the second body node NB2n may be electrically connected to each other.

Referring to FIGS. 7 and 8, a complementary voltage VNn1–b of the (n–1)$^{th}$ node voltage VNn–1 may be a voltage periodically charging between the (n–2)$^{th}$ voltage –(n–2)·VDD having a magnitude of (n–2) times the power voltage VDD and the (n–1)$^{th}$ voltage –(n–1)·VDD having a magnitude of (n–1) times the power voltage VDD A switch signal SWn1b input to the gate of the first transistor PTnb of the complementary circuit and the switch signal SWn2b input to the gate of the second transistor NTb may be identical to the n$^{th}$ node voltage VNn. The switch signals SWn1b and SWn2b may be complementary to the switch signal SWn2 that controls the N-type transistor NT' and the switch signal SWn1 that controls the n$^{th}$ P-type transistor PTn.

The sub-node voltage VNnb of the sub node Nnb may be identical to the switch signal SWn2 controlling the N-type transistor NT' and the switch signal SWn1 controlling the n$^{th}$ P-type transistor PTn. The capacitor Cnb of the complementary circuit receives the complementary voltage VNn–1b of the (n–1)$^{th}$ node voltage VNn–1, and the first transistor PTnb of the complementary circuit is controlled by the switch signal SWn1b that is complementary to the switch signal SWn1 of the n$^{th}$ P-type transistor PTn, and therefore, the sub-node voltage VNnb of the sub node Nnb may be complementary to the n$^{th}$ node voltage VNn.

According to an example embodiment, when the clock inversion signal CLKb is the power voltage VDD in FIG. 8, the switch signal SWn2b input to the gate of the second transistor NTb may be the n$^{th}$ negative voltage –n·VDD, and the second transistor NTb may be turned on. The n$^{th}$ node Nn and the output terminal OP are connected to each other, and the sub-node voltage VNnb may be output as the output voltage VOUT from the output terminal OP of the nth pump unit 100_n'.

On the contrary, when the clock inversion signal CLK is the ground voltage GND in FIG. 8, the switch signal SWn2 controlling the N-type transistor NT' may be the nth negative voltage –n·VDD. The N-type transistor NT' may be turned on, and the n$^{th}$ node voltage VNn may be output as the output voltage VOUT from the output terminal OP of the n$^{th}$ pump unit 100_n'. Accordingly, when the clock inversion signal CLKb is the ground voltage GND or the power voltage VDD, the output voltage VOUT that is output from the output terminal OP may constantly and stably maintain the magnitude of n times the power voltage VDD.

Figure 9:
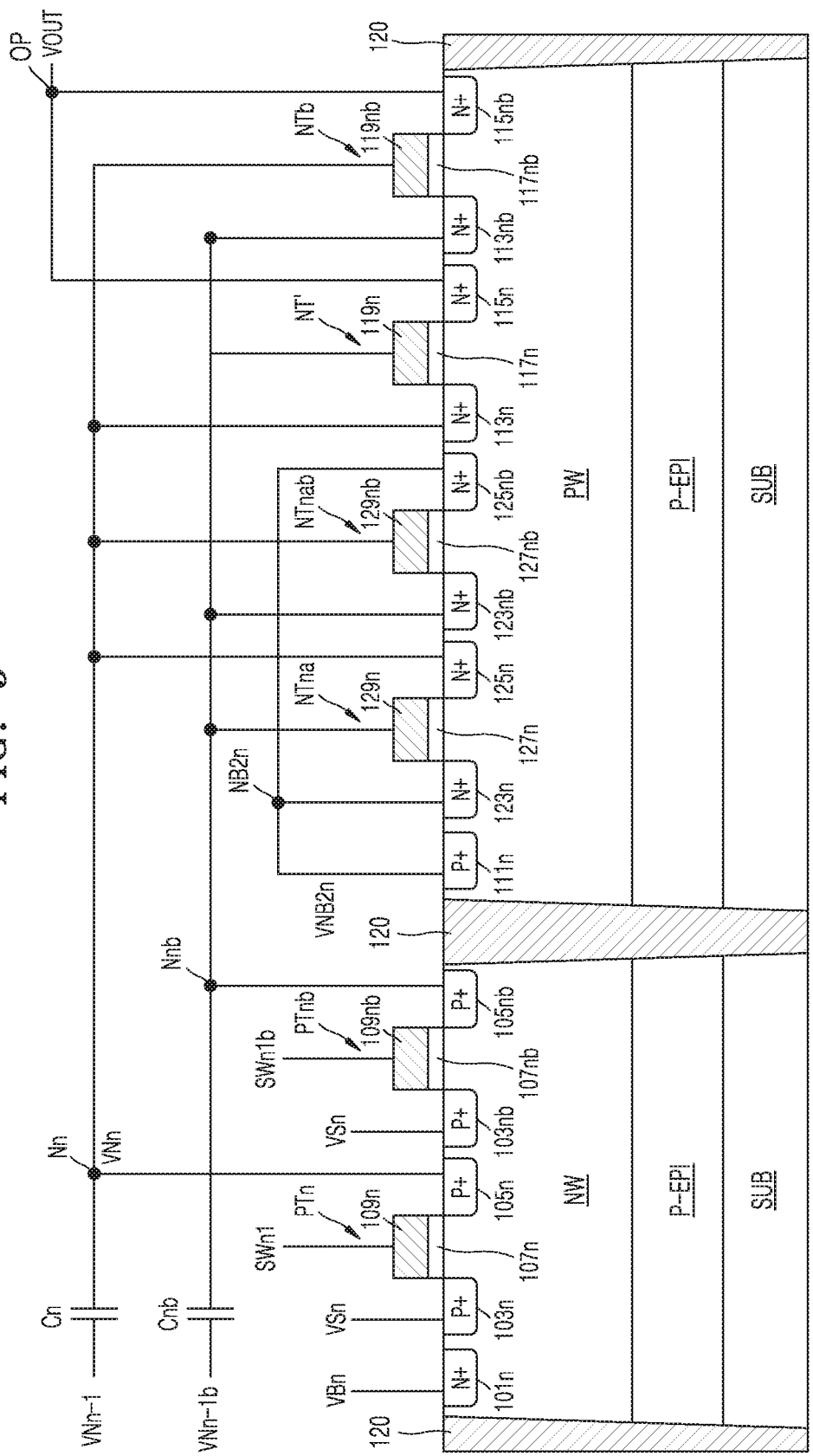
FIG. 9 is a cross-sectional view for describing the charge pump circuit of FIG. 7, according to an example embodiment.

FIG. 9 is a cross-sectional view for describing the charge pump circuit of FIG. 7, according to an example embodiment. FIG. 9 shows the nth pump unit shown in FIG. 7.

Referring to FIG. 9, the charge pump circuit may include the substrate SUB, the epitaxial layer P-EPI formed in the substrate SUB, and wells NW and PW formed in the epitaxial layer P-EPI. The wells NW and PW may include an N well NW doped with the N-type impurity and a P well doped with the P-type impurity.

The n$^{th}$ P-type transistor PTn and the first transistor PTnb of the complementary circuit may be formed in the N well NW. The first P-type region 103n, the second P-type region 105n, and the N-type region 101n, which are formed in the N well NW, and the first gate insulating layer 107n and the first gate electrode 109n, which are formed above the N well NW, may construct the n$^{th}$ P-type transistor PTn. A third P-type region 103nb, a fourth P-type region 105nb, and the N-type region 101n, which are formed in the N well NW, and a second gate insulating layer 107nb, and a second gate electrode 109nb, which are formed above the N well NW, may construct the first transistor PTnb of the complementary circuit.

The first P-type region 103n and the second P-type region 105n, which are formed in the N well NW, may constitute different electrodes of the n$^{th}$ P-type transistor PTn, and may be a source and a drain, respectively. The third P-type region 103nb and the fourth P-type region 105nb, which are formed in the N well NW, may constitute different electrodes of the first transistor PTnb of the complementary circuit and may be a source and a drain, respectively.

The N-type region 101n formed in the N well NW may be a contact region for applying a voltage to a body of the n$^{th}$ P-type transistor PTn and a body of the first transistor PTnb of the complementary circuit. For example, the n$^{th}$ body voltage VBn may be applied to the N well NW through the N-type region 101n.

N-type transistors NT', NTb, NTna, and NTnab may be formed in the P well PW. The first N-type region 113n, the second N-type region 115n, and the P-type region 111n, which are formed in the P well PW, and a first gate insulating layer 117n and a first gate electrode 119n, which are formed above the P well PW, may construct the N-type transistor NT'. The first N-type region 113n and the second N-type region 115n, which are formed in the P well PW, may constitute different electrodes of the N-type transistor NT', and may be a source and a drain, respectively.

The third N-type region 113nb, the fourth N-type region 115nb, and the P-type region 111n, which are formed in the P well PW, and the second gate insulating layer 117nb and the second gate electrode 119nb, which are formed above the P well PW, may construct the second transistor NTb of the complementary circuit. The third N-type region 113nb and the fourth N-type region 115b, which are formed in the P well PW, may constitute different electrodes of the second transistor NTb and may be a source and a drain, respectively.

A fifth N-type region 123nb, a sixth N-type region 125nb, the P-type region 111n, which are formed in the P well PW, and a third gate insulating layer 127nb and a third gate electrode 129nb, which are formed above the P well PW, may construct the third transistor NTnab of the complementary circuit. The fifth N-type region 123nb and the sixth N-type region 125nb, which are formed in the P well PW, may constitute different electrodes of the third transistor NTnab, and may be a source and a drain, respectively.

The seventh N-type region 123n, the eighth N-type region 125n, and the P-type region 111n, which are formed in the P well PW, and a fourth gate insulating layer 127n and a fourth gate electrode 129n, which are formed above the P well PW, may construct the fourth transistor NTna. The seventh N-type region 123n and the eighth N-type region 125n, which are formed in the P well PW, may constitute different electrodes of the fourth transistors NTna, and the electrodes may be a source and a drain, respectively.

The charge pump circuit of the example embodiment illustrated in FIG. 9 may include the wells NW and PW that are formed in the substrate SUB, the wells NW and PW in which the plurality of transistors are formed. In this case, the isolation layer 120 may be formed to surround the wells NW and PW to which different voltages are respectively applied. Accordingly, due to the isolation layer 120, junction breakdown that may occur due to a difference between voltages respectively applied to different wells NW and PW may be prevented, and the number of pump units that are included in the charge pump apparatus and connected to one another in series may increase.

Figure 10:
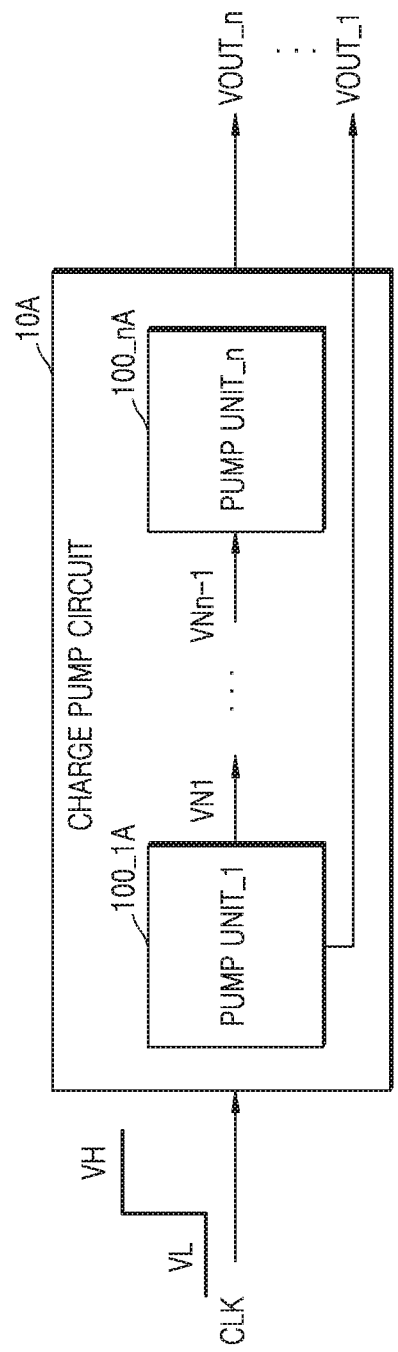
FIG. 10 is a block diagram for describing a charge pump circuit according to an example embodiment.
Figure 11:
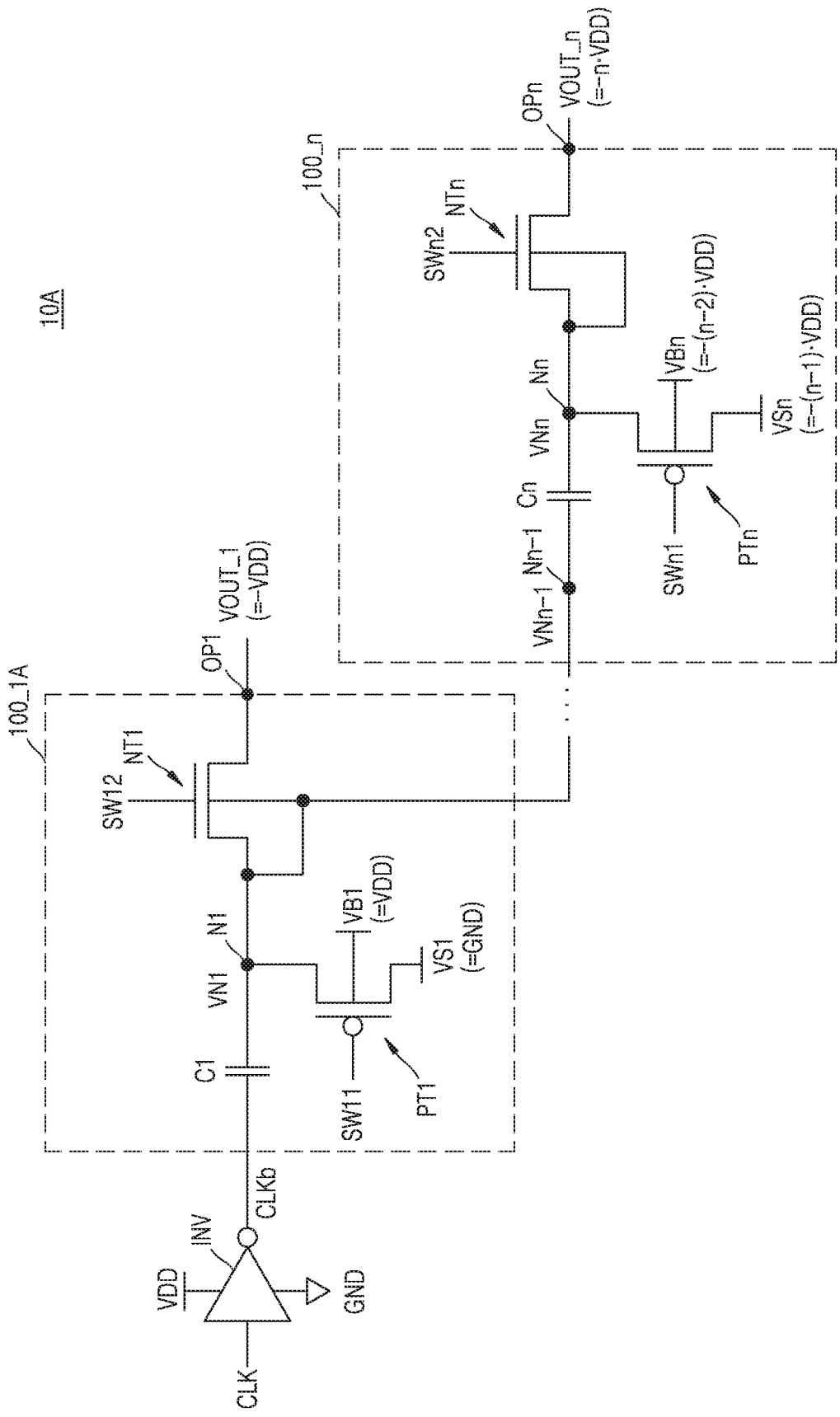
FIG. 11 is a circuit diagram for describing the charge pump circuit of FIG. 10, according to an example embodiment.

FIG. 10 is a block diagram for describing a charge pump circuit 10A according to an example embodiment. FIG. 11 is a circuit diagram for describing the charge pump circuit 10A of FIG. 10, according to an example embodiment. In the descriptions regarding FIGS. 10 and 11, repeated description will be omitted for the same reference numerals as those of FIGS. 2 and 3 for conciseness.

Referring to FIGS. 10 and 11, the charge pump circuit 10A may receive the clock signal CLK to generate the first through $n^{th}$ output voltages VOUT_1 through VOUT_n and output the first through $n^{th}$ output voltages VOUT_1 through VOUT_n to the active pixel sensor array (for example, the active pixel sensor array 20 of FIG. 1). In this case, n may be a natural number equal to or greater than 2, and in an example embodiment, n may be a natural number equal to or greater than 3.

The charge pump circuit 10A may include the inverter INV and first through $n^{th}$ pump units 100_1A through 100_nA. The first through $n^{th}$ pump units 100_1A through 100_nA may be connected to one another in series, and the first through $n^{th}$ pump units 100_1A through 100_nA may respectively output corresponding output voltages. For example, the first pump unit 100_1A may output a first output voltage V_OUT1 from a first output terminal OP1, and the $n^{th}$ pump unit 100_nA may output an $n^{th}$ output voltage VOUT_n from a $n^{th}$ output terminal OPn. The first through $n^{th}$ pump units 100_1A through 100_nA may respectively negative output voltages whose absolute values sequentially and gradually increase.

In an example embodiment, a magnitude of the absolute value of the $n^{th}$ output voltage VOUT_n may be greater than a magnitude of an absolute value of the high-level voltage VH. For example, the magnitude of the $n^{th}$ output voltage VOUT_n may be n times the magnitude of the absolute value of the high-level voltage VH.

The first through nth pump units 100_1A through 100_nA may each include a capacitor for accumulating charge, a P-type transistor, and an N-type transistor. However, example embodiments are not limited thereto, and at least one pump unit of the first through $n^{th}$ pump units 100_1A through 100_nA may omit one of the N-type transistor or the P-type transistor.

The first pump unit 100_1A may include the first capacitor C1, the first P-type transistor PT1, and the first N-type transistor NT1. A drain of the first N-type transistor NT1 may be connected to the first node N1, and a body of the first N-type transistor NT1 may be connected to the first node N1. A switch signal SW12 may be provided as a control signal to the gate of the first N-type transistor NT1. The first N-type transistor NT1 may be connected to the first output terminal OP and output the first output voltage VOUT_1 in response to the switch signal SW12.

The $n^{th}$ pump unit 100_nA may include the $n^{th}$ capacitor Cn, the $n^{th}$ P-type transistor PTn, and the $n^{th}$ N-type transistor NTn. A drain of the $n^{th}$ N-type transistor NTn may be connected to the $n^{th}$ node Nn, and a body of the $n^{th}$ N-type transistor NTn may be connected to the $n^{th}$ node Nn. The switch signal SWn2 may be provided as a control signal to a gate of the $n^{th}$ N-type transistor NTn. The $n^{th}$ N-type transistor NTn may be connected to the $n^{th}$ output terminal OPn and output the $n^{th}$ output voltage VOUTn in response to the switch signal SWn2.

Figure 12A:
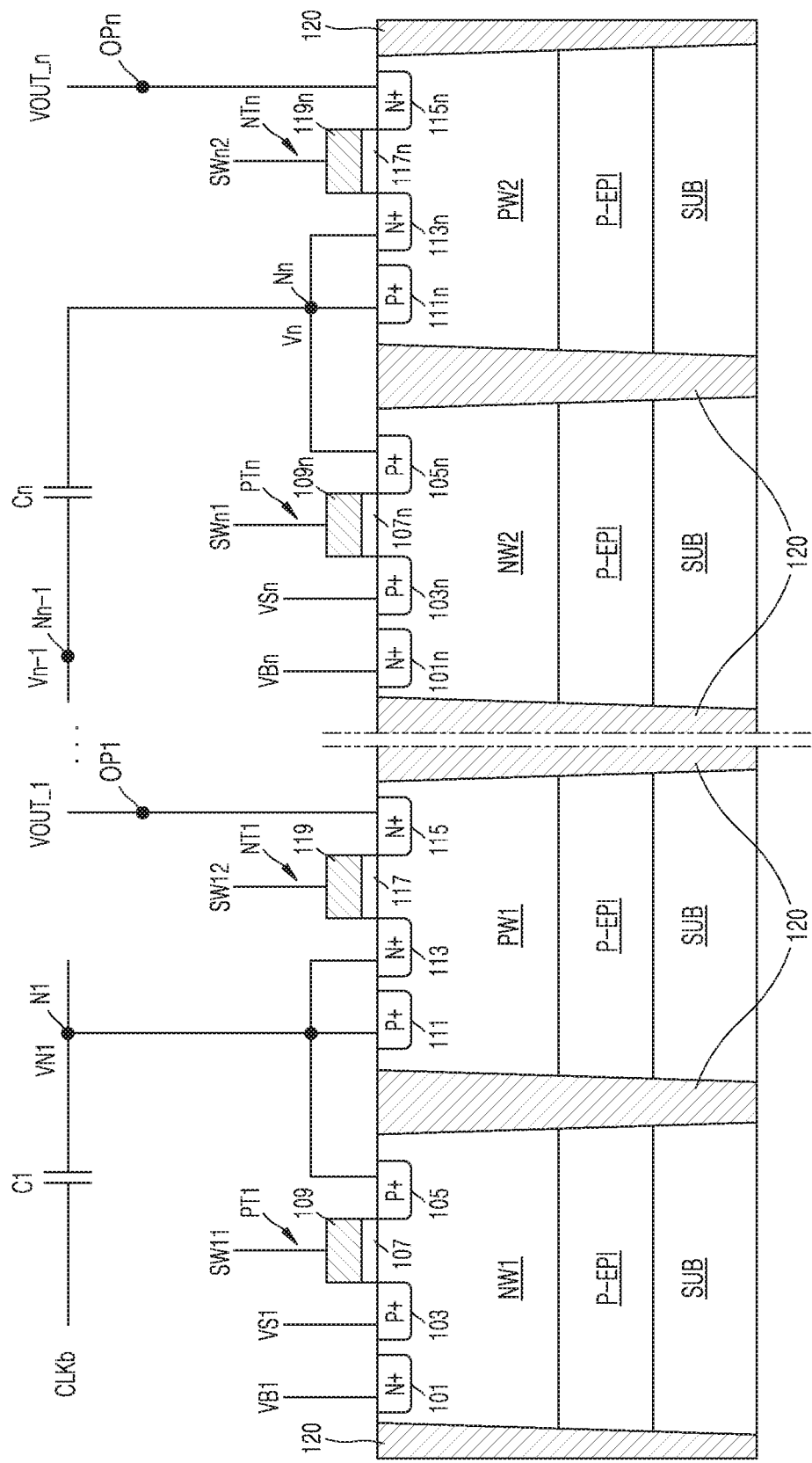
FIGS. 12A and 12B are cross-sectional views for describing the charge pump circuit of FIG. 11, according to an example embodiment.
Figure 12B:
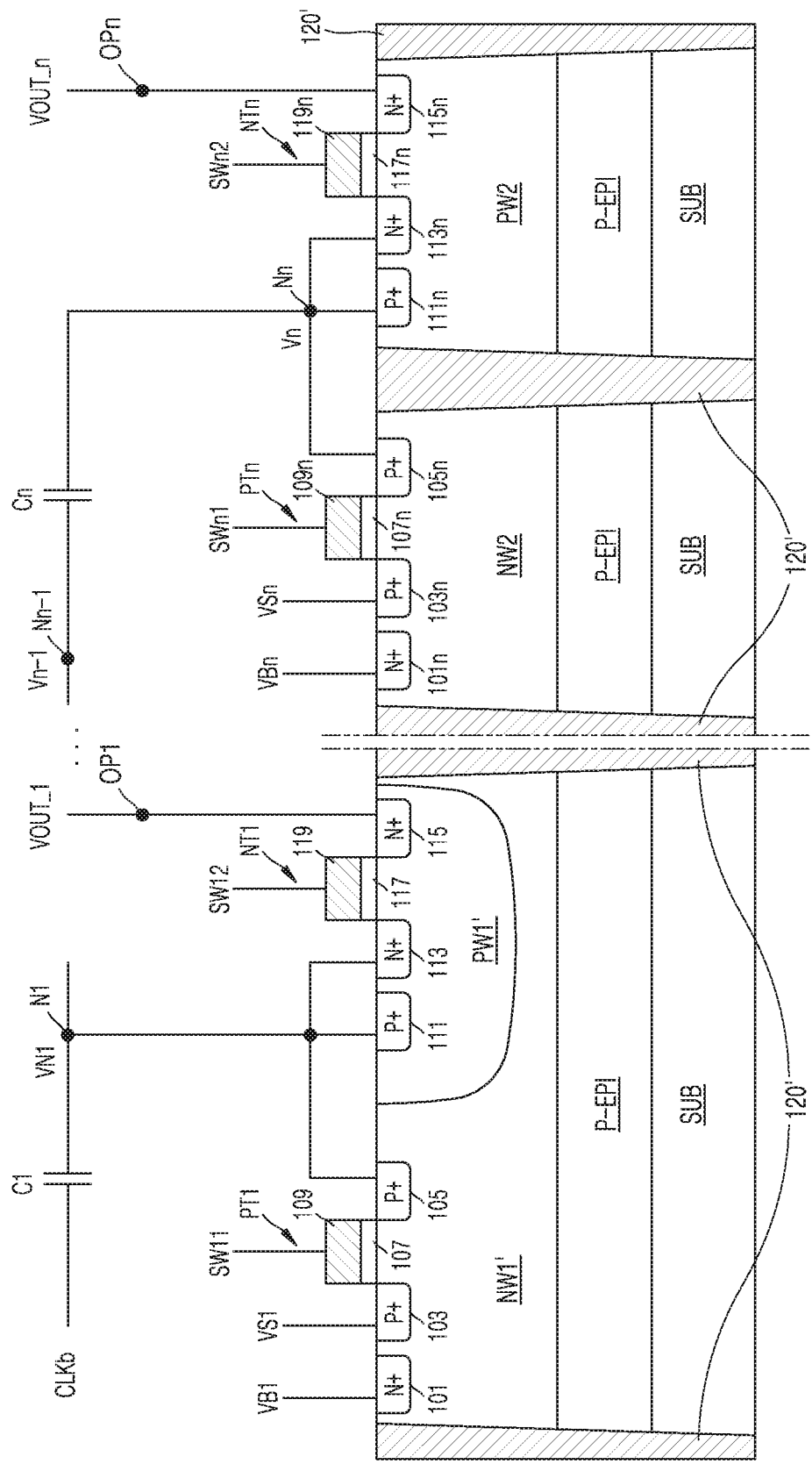

FIGS. 12A and 12B are cross-sectional views for describing the charge pump circuit 10A of FIG. 11, according to an example embodiment. FIGS. 12A and 12B are views of the charge pump circuit 10A shown in FIG. 11, only excluding the inverter INV. In descriptions regarding FIGS. 12A and 12B, descriptions will not be repeated for the same reference numerals as those of FIG. 5 for conciseness.

Referring to FIG. 12A, the charge pump circuit 12A may include the substrate SUB, the epitaxial layer P-EPI formed in the substrate SUB, and the wells NW1, PW1, NW2, and PW2 formed in the epitaxial layer P-EPI. The wells NW1, PW1, NW2, and PW2 may include the first well NW1 and the second well NW2, which are doped with an N-type impurity, and the third well PW1 and the fourth well PW2 doped with a P-type impurity.

The first N-type transistor NT1 may be formed in the third well PW1. The first N-type region 113, the second N-type region 115, the P-type region 111, which are formed in the third well PW1, and the gate insulating layer 117 and the gate electrode 119, which are formed above the third well PW1, may construct the first N-type transistor NT1. The gate insulating layer 117 may be formed between the third well PW1 and the gate electrode 119.

A first N-type region 113 and a second N-type region 115, which are formed in the third well PW1, may respectively constitute different electrodes of the first N-type transistor NT1, and may be a source and a drain, respectively. The first N-type region 113 may be connected to the first node N1, and the first node voltage VN1 may be applied to the first N-type region 113. The second N-type region 115 may be connected to the first output terminal OP1. The switch signal SWn2 may be applied to the gate electrode 119n.

The P-type region 111 formed in the third well PW3 may be a contact region for applying a voltage to a body of the first N-type transistor NT1. For example, the third well PW1 may be connected to the first node N1 through the P-type region, and the first node voltage VN1 may be applied to the third well PW1.

The $n^{th}$ N-type transistor NTn may be formed in the fourth well PW2. The first N-type region 113n, the second N-type region 115n, the P-type region 111n, which are formed in the fourth well PW2, and the gate insulating layer 117n and the gate electrode 119n, which are formed above the fourth well PW2, may construct the $n^{th}$ N-type transistor NTn. The gate insulating layer 117n may be formed between the fourth well PW2 and the gate electrode 119n.

The first N-type region 113n and the second N-type region 115n, which are formed in the fourth well PW2, may respectively constitute different electrodes of the $n^{th}$ N-type transistor NTn, and may be a source and a drain, respectively. The first N-type region 113n may be connected to the $n^{th}$ node Nn, and the $n^{th}$ node voltage VNn may be applied to the first N-type region 113n. The second N-type region 115n may be connected to the nth output terminal OPn. The switch signal SWn2 may be applied to the gate electrode 119n.

The P-type region 111n formed in the fourth well PW2 may be a contact region for applying a voltage to a body of the nth N-type transistor NTn. For example, the fourth well PW2 may be connected to the $n^{th}$ node Nn through the P-type region 111n, and the $n^{th}$ node voltage VNn may be applied to the fourth well PW2.

The isolation layer 120 may be formed between the first well NW1, the third well PW1, the second well NW2, and the fourth well PW2 to which respectively different voltages are applied. The isolation layer 120 may be formed to surround each of the first well NW1, the second well NW2, the third well PW1, and the fourth well PW2.

Referring to FIG. 12B, a third well PW1', in which the first N-type transistor NT1 included in the first pump unit is formed, may be formed in a first well NW1', in which the first P-type transistor included in the first pump unit is formed. Compared to the nth pump unit, voltages having relatively less magnitudes may be applied to the first pump unit of the charge pump circuit. Accordingly, compared to the nth pump unit, the first pump unit has relatively less possibility of a junction breakdown occurring. Therefore, an area occupied by the charge pump circuit may be reduced by forming third well PW1' in the first well NW1' without forming the isolation layer 120' between the first well NW1' and the third well PW1'.

However, example embodiments are not limited to what is shown in FIG. 12B, and in some example embodiments it is also possible that the first well NW1' is formed in the third well PW1'. In addition, when n is equal to or greater than 3, an N well, in which the second P-type transistor included in the second pump unit is formed, and a P well, in which the second N-type transistor is formed, may not be insulated by using the isolation layer 120'. That is, in some example embodiments, the P well may be formed in the N well in which the second pump unit is formed.

Figure 13:
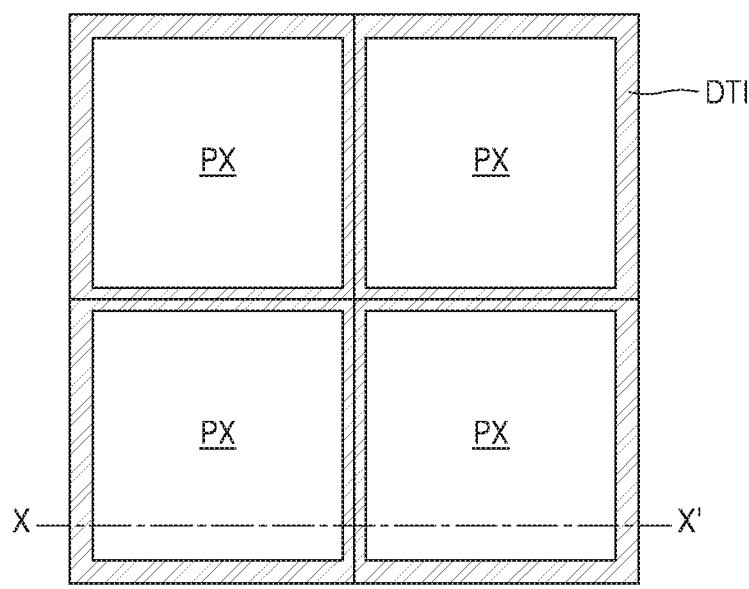
FIG. 13 is a top-plan view for describing an active pixel sensor array of an image sensor according to an example embodiment.
Figure 14A:
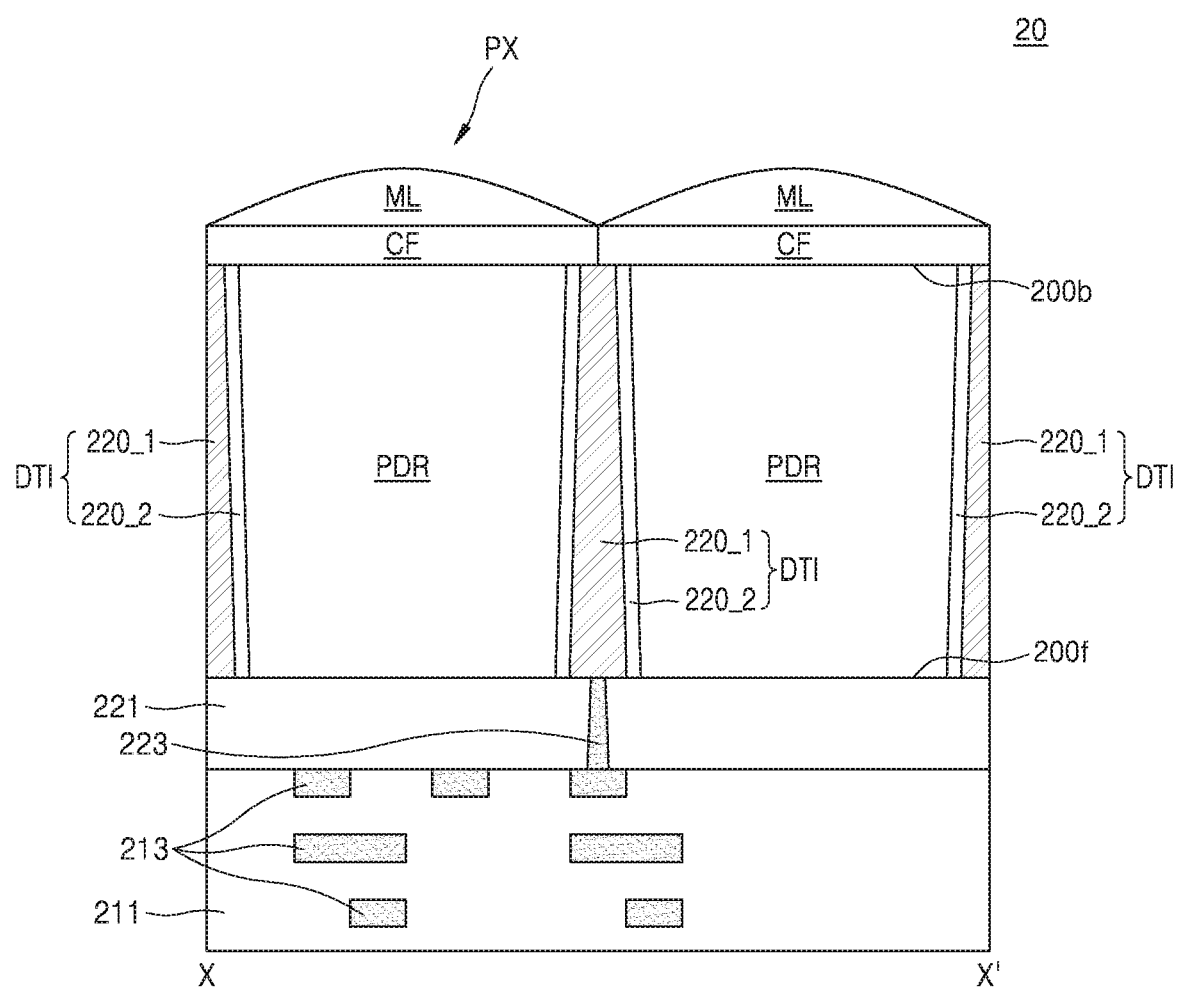
FIGS. 14A through 14C are cross-sectional views taken along line X-X' shown in FIG. 13.
Figure 14B:
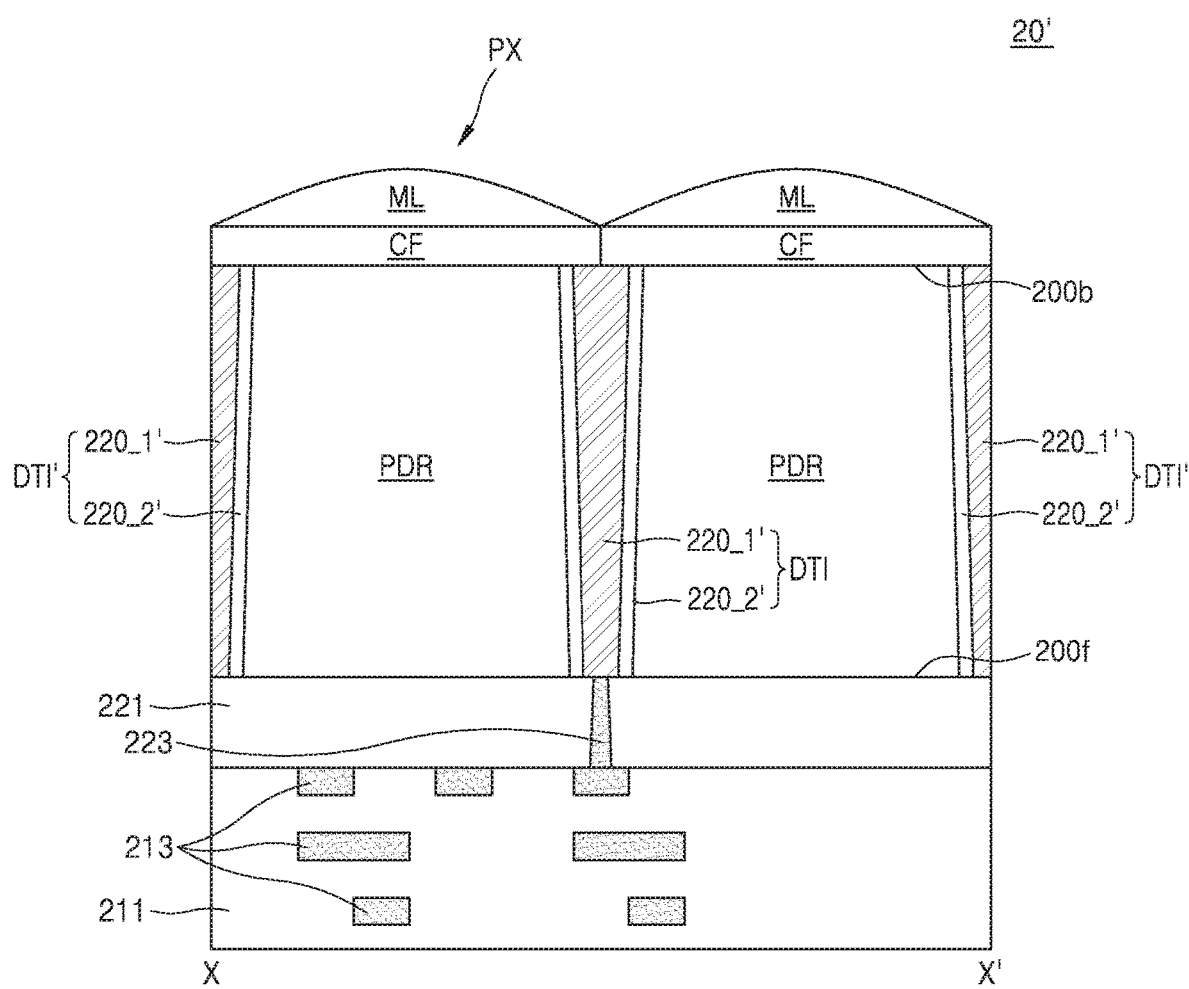
Figure 14C:
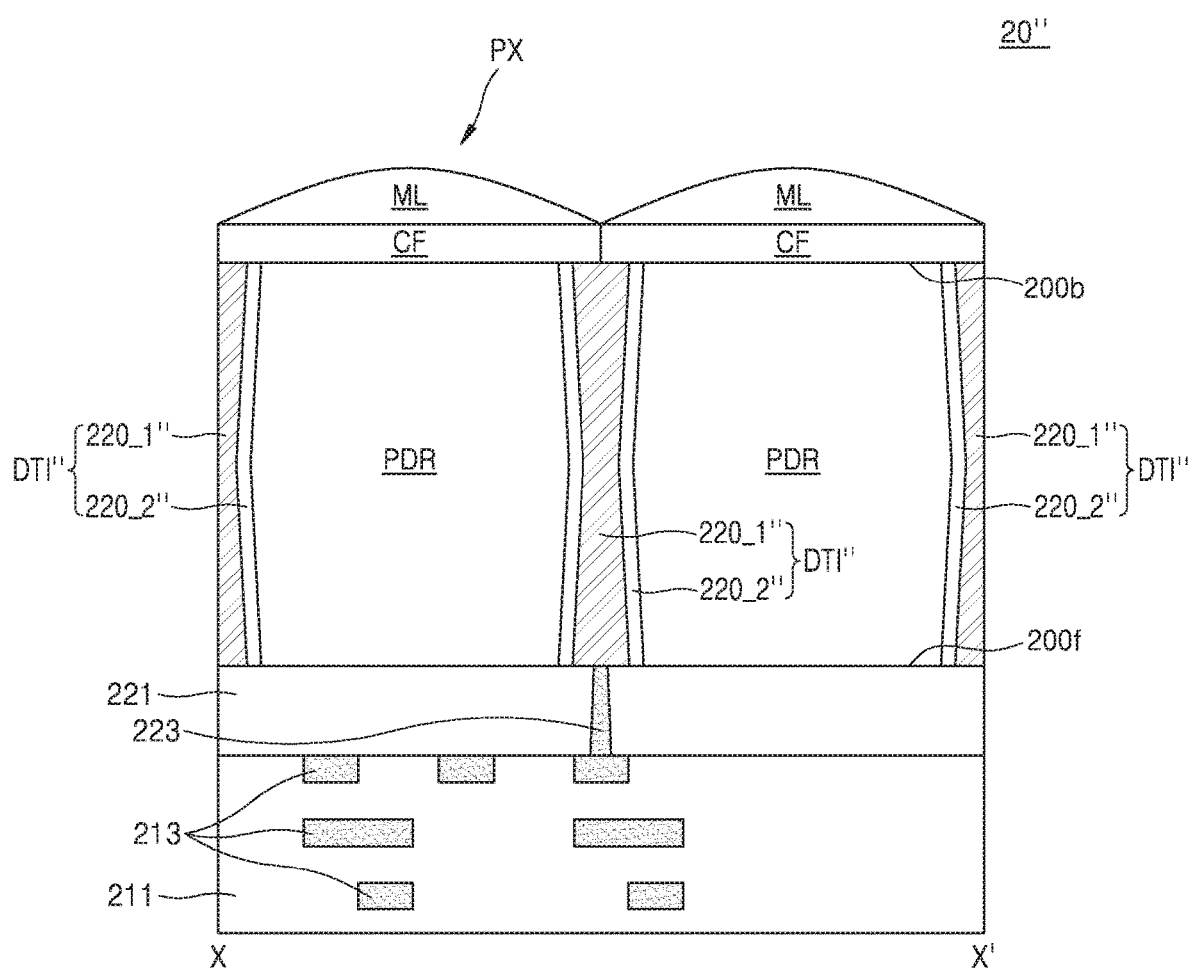

FIG. 13 is a top-plan view for describing the active pixel sensor array of an image sensor according to an example embodiment. FIGS. 14A through 14C are cross-sectional views taken along line X-X' shown in FIG. 13.

Referring to FIGS. 13 and 14A, the active pixel sensor array 20 may include the plurality of pixels PX. The plurality of pixels PX may be arranged in a matrix. The isolation layer DTI may surround each of the plurality of pixels PX and separate the plurality of pixels PX from one another. That is, the plurality of pixels PX may each be defined by the isolation layer DTI.

In an example embodiment, the isolation layer DTI may include a first isolation layer 220_1 and a second isolation layer 220_2. The first isolation layer 220_1 may include a material having an extraordinary gap fill performance, for example, polysilicon. According to an example embodiment, the first isolation layer 220_1 may be doped with a P-type impurity such as boron (B), but example embodiments are not limited thereto. According to an example embodiment, the first isolation layers 220_1 may have an identical length in the vertical direction to separate the plurality of pixels PX from one another.

The second isolation layer 220_2 may include an insulating material. According to an example embodiment, the second isolation layer 220_2 may include a material having a high dielectric permittivity, but example embodiments are not limited thereto.

In an example embodiment, a width of the isolation layer DTI may decrease away from the first surface 200f and toward the second surface 200b. In other words, the width of the isolation layer DTI may decrease as a distance from the first surface 200f increases. For example, in the isolation layer DTI, a first width of a surface contacting the first surface 200f may be greater than a second width of a surface contacting the second surface 200b. In an example embodiment, the isolation layer DTI may be formed by etching a portion of the photodiode region PDR from the first surface 200f in the vertical direction and the etched portion may be filled with a material included in the second isolation layer 220_2 and a material included in the first isolation layer 220_1.

According to an example embodiment, the output voltage (for example, the output voltage VOUT of FIG. 1) may be applied to the first isolation layer 220_1 through a contact via 223. The output voltage VOUT applied to the first isolation layer 220_1 may be, for example, the output voltage VOUT described with reference to FIGS. 2 through 9, and may be one of the first through $n^{th}$ output voltages VOUT_1 through VOUT_n described with reference to FIGS. 10 and 11. FIG. 14A shows that the contact via 223 configured to apply the output voltage VOUT is arranged adjacent the first surface 200f, but example embodiments are not limited thereto. For example, the contact via 223 may be arranged adjacent the second surface 200b, or adjacent the first surface 200f and the second surface 200b.

A photodiode may be formed in a photodiode region PDR. According to an example embodiment, a voltage lower than that of the photodiode region PDR may be applied to the first isolation 220_1 to reduce an dark current by augmenting an energy barrier between the first isolation layer 220_1 and the photodiode region PDR. Accordingly, reliability of the image sensor may be improved.

An interlayer insulating layer 211 and a front-surface line 213 may be arranged above and on the first surface 200f. The front-surface line 213 may be covered, protected, and insulated by the interlayer insulating layer 211.

The interlayer insulating layer 211 may include, for example, silicon oxide, silicon nitride, silicon oxynitride, and the like. The front-surface line 213 may include, for example, aluminum (Al), copper (Cu), tungsten (W), cobalt (Co), ruthenium (Ru), and the like.

The front-surface line 213 may include a plurality of lines that are sequentially stacked. FIG. 14A shows that the front-surface line 213 includes three layers that are sequentially stacked, but the front-surface line 213 example embodiments are not limited thereto.

An insulating layer 221 may be arranged between the first surface 200f and the interlayer insulating layer 211. The insulating layer 221 may cover the contact via 223 and protect the contact via 223. According to an example embodiment, the insulating layer 221 may include an insulating material such as silicon oxide, silicon nitride, and/or silicon oxynitride.

A color filter CF may be arranged on the photodiode region PDR, and a microlens ML may be arranged on the color filter CF. The microlens ML may include an organic material such as a photosensitive resin or an inorganic material. The microlens ML may collect incident light to a pixel PX.

Referring to FIG. 14B, the isolation layer DTI' may include a first isolation layer 220_1' and a second isolation layer 220_2'. According to an example embodiment, a width of a cross-section of the isolation layer DTI' may increase away from the first surface 200f and toward the second surface 200b. In other words, the width of the cross-section of the isolation layer DTI' may increase as a distance from the first surface 200f increases. For example, in the isolation layer DTI', a first width of a surface contacting the first surface 200f may be less than a second width of a surface contacting the second surface 200b. According to an example embodiment, the isolation layer DTI' may be formed by etching a portion of the photodiode region PDR from the second surface 200b in a vertical direction and filling the etched portion with a material.

However, unlike shown in FIG. 14B, in some example embodiments, the isolation layer DTI' may not contact the first surface 200f. In this case, the contact via 223 may be formed to contact the second surface 200b and provide the output voltage VOUT to the isolation layer DTI'.

Referring to FIG. 14C, an isolation layer DTI" may include a first isolation layer 220_1" and a second isolation layer 220_2". According to an example embodiment, a width of a cross-section of the isolation layer DTI" may decrease from the first surface 200f towards a center and may decrease from the second surface 200b towards the center. In other words, the width of the cross-section of the isolation layer DTI" may decrease as a distance from the first surface 200f increases, and may decrease as a distance from the second surface 200b SUB increases. For example, in the isolation layer DTI", a first width of a surface contacting the first surface 200f may be greater than a third width of a cross-section of the center of the isolation layer DTI", and a second width of a surface contacting the second surface 200b may be greater than the third width. In an example embodiment, the isolation layer DTI" may be formed by etching a portion of the photodiode region PDR from the first surface 200f in the vertical direction, etching another portion of the photodiode region PDR from the second surface 200b in the vertical direction, and filling the etched portions with materials. Alternatively, in some example embodiments, the isolation layer DTI" may also be formed by etching a portion of the photodiode region PDR from the second surface 200b in the vertical direction, forming another portion of the photodiode region PDR from the first surface 200f in the vertical direction, and filling the etched portions with materials.

Figure 15A:
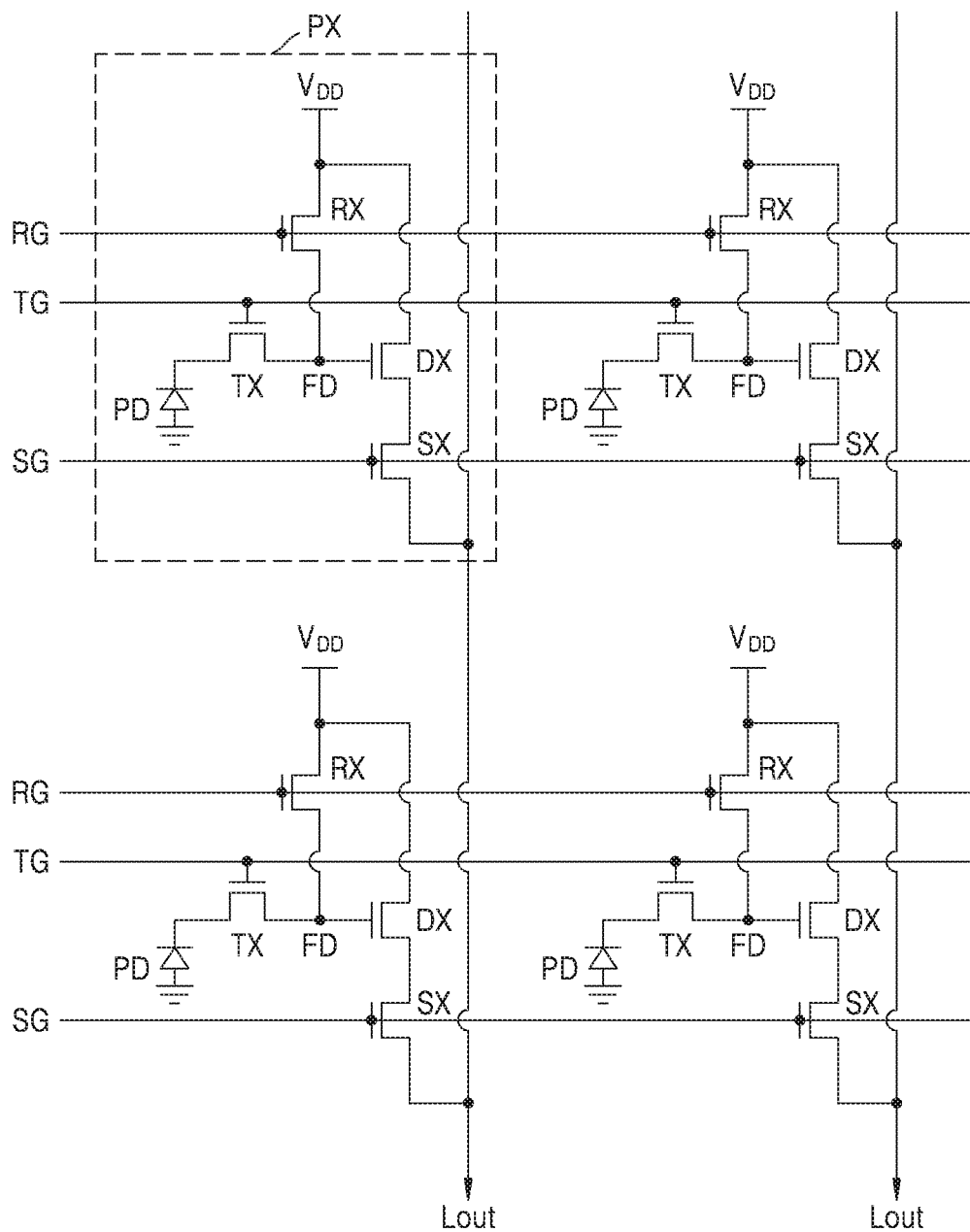
FIG. 15A is a circuit diagram for describing an active pixel sensor array of an image sensor according to an example embodiment.
Figure 15B:
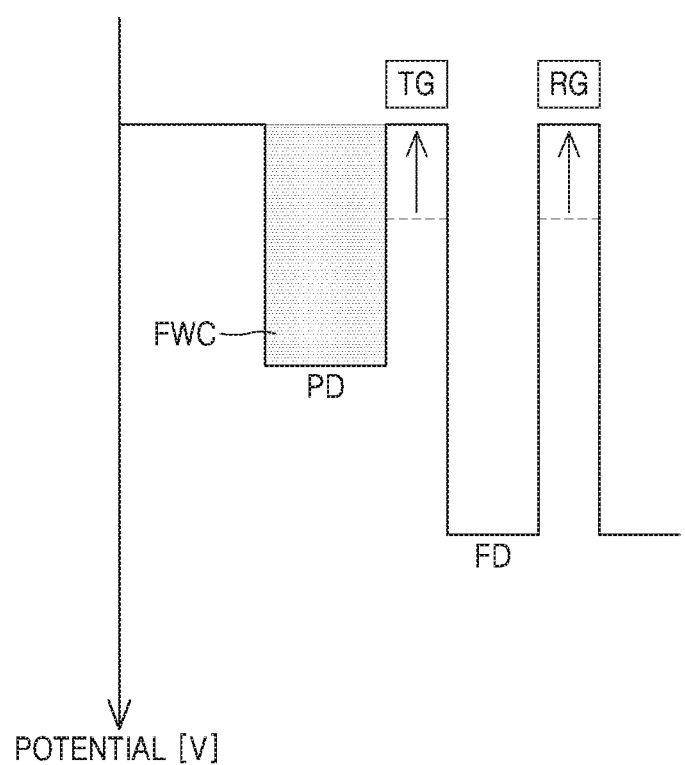
FIG. 15B is a diagram for describing control signals applied to the active pixel sensor array shown in FIG. 15A, according to an example embodiment.

FIG. 15A is a circuit diagram for describing the active pixel sensor array 20 of the image sensor according to an example embodiment. FIG. 15B is a drawing for describing control signals applied to the active pixel sensor array 20 shown in FIG. 15A.

Referring to FIG. 15A, the active pixel sensor array 20 includes the plurality of pixels PX, and the pixels PX may be arranged in a matrix. According to an example embodiment, each of the pixels PX may include a transmitting transistor TX and logic transistors RX, SX, and DX. Here, the logic transistors may include a resetting transistor RX, a selecting transistor RX, and a driving transistor DX.

A photoelectric transformation element PD may generate and accumulate an optical charge in proportion to an amount of light incident from outside. Any one of a photodiode, a photo transistor, a photo gate, a Pinned Photo Diode (PPD), or a combination thereof may be used as the photoelectric transformation element PD.

The transmitting transistor TX may transmit the optical charge accumulated in the photoelectric transformation element PD to a floating diffusion region FD in response to a charge transmission signal TG, and the optical charge generated in the photoelectric transformation element PD may be stored in the floating diffusion region FD. The driving transistor DX may be controlled based on the amount of optical charge accumulated in the floating diffusion region FD.

The resetting transistor RX may periodically reset the optical charge accumulated in the floating diffusion region FD, in response to a reset signal RG. A drain electrode of the resetting transistor RX may be connected to the floating diffusion region FD, and a source electrode of the resetting transistor RX may be connected to the power voltage VDD. When the resetting transistor RX is turned on, the power voltage VDD connected to the source electrode of the resetting transistor RX may be delivered to the floating diffusion region FD. Accordingly, when the resetting transistor RX is turned on, the optical charges accumulated in the floating diffusion region FD may be discharged and the floating diffusion region FD may be reset.

The driving transistor DX performs a source follower function in combination with a positive current source outside of the pixel PX, amplify potential change in the floating diffusion region FD and output the potential change through an output line Lout. The selecting transistor SX may select pixels PX to be read in column unit, in response to the pixel selection signal SG. When the selecting transistor SX is turned on, the power voltage VDD may be delivered to a source electrode of the driving transistor DX.

Referring to FIGS. 15A and 15B, when light incident on the photoelectric transformation element PD, the photoelectric transformation element PD may generate and accumulate an optical charge. According to an example embodiment, an output voltage (for example, the output voltage VOUT shown in FIG. 1) may be applied as a charge transmission signal TG to the transmitting transistor TX of at least one pixel of the plurality of pixels PX. The output voltage VOUT may be, for example, the output voltage VOUT described with reference to FIGS. 2 through 9, and may also be an output voltage selected from the first through $n^{th}$ output voltage VOUT_1 through VOUT_n described with reference to FIGS. 10 and 11.

As a high negative voltage is applied to the transmitting transistor TX, a difference between a potential of a gate of the transmitting transistor TX and a potential of the photoelectric transformation element PD may increase. Accordingly, a full-well capacitance, which is a capacitance of the optical charge accumulated in the photoelectric transformation element PD, may increase.

According to an example embodiment, the output voltage VOUT may be applied as a resetting signal RG to at least one resetting transistor RX of the plurality of pixels PX. As a high negative voltage is applied to the resetting transistor RX, a difference between a potential of a gate of the resetting transistor RX and a potential of the floating diffusion region FD may increase. Accordingly, a full-well capacitance, which is a capacitance of the optical charge in the floating diffusion region FD, may increase.

While the inventive concept has been particularly shown and described with reference to various example embodiments thereof, it will be understood that various changes in form and details may be made therein without departing from the spirit and scope of the following claims.

What is claimed is:

1. A charge pump circuit in a semiconductor substrate, the charge pump circuit comprising:
   a first pump unit comprising a first capacitor and a first transistor, the first pump unit configured to generate a first node voltage at a first node by using a clock signal; and
   a second pump unit comprising a second capacitor, a second transistor, and a third transistor, the second capacitor having a first terminal connected to the first node and a second terminal connected to the second transistor, the second pump unit configured to generate a negative output voltage by using the first node voltage,
   wherein the clock signal and the first node voltage are each toggled between a low-level voltage and a high-level voltage,
   a magnitude of an absolute value of the negative output voltage is greater than a magnitude of an absolute value of the high-level voltage of the clock signal, and
   a body of the third transistor is physically isolated from a body of the second transistor by an isolation layer formed through the semiconductor substrate.

2. The charge pump circuit of claim 1, wherein the second transistor includes an n-type transistor and the third transistor includes a p-type transistor.

3. The charge pump circuit of claim 2, wherein the n-type transistor is formed in a well in which the second transistor is formed.

4. The charge pump circuit of claim 1, wherein the magnitude of the absolute value of the negative output voltage is equal to or greater than twice the magnitude of the absolute value of the high-level voltage of the clock signal.

5. The charge pump circuit of claim 1, wherein
the first pump unit outputs a first output voltage having a constant magnitude,
the second pump unit outputs a second output voltage having a constant magnitude, and
a magnitude of an absolute value of the second output voltage is greater than a magnitude of an absolute value of the first output voltage.

6. The charge pump circuit of claim 1, wherein
the first pump unit further comprises a fourth transistor, and
the charge pump circuit further comprises an isolation layer that physically insulates a body of the fourth transistor from a body of the first transistor.

7. The charge pump circuit of claim 1, wherein
the first pump unit further comprises a fourth transistor, and
a well forming a body of the fourth transistor is formed in a well forming a body of the first transistor.

8. The charge pump circuit of claim 1, wherein the charge pump circuit further comprises an inverter configured to receive the clock signal and provide a clock inversion signal to the first pump unit.

9. A charge pump circuit configured to generate a negative output voltage by receiving a clock signal, the charge pump circuit comprising:
a substrate in which a first well and a second well are formed;
a first pump unit comprising a first capacitor and a first transistor formed in the first well;
a second pump unit comprising a second capacitor and a second transistor formed in the second well; and
an isolation layer configured to physically insulate the first well from the second well,
wherein the clock signal is toggled between a low-level voltage and a high-level voltage at a regular period, and
a magnitude of an absolute value of the negative output voltage is greater than a magnitude of an absolute value of the high-level voltage,
wherein the substrate comprises a first surface in which the first transistor is formed, and a second surface opposite from the first surface, and
the isolation layer extends from the first surface to the second surface.

10. The charge pump circuit of claim 9, wherein a first width of a cross-section of the isolation layer that contacts the first surface is less than a second width of a cross-section of the isolation layer that contacts the second surface.

11. The charge pump circuit of claim 9, wherein
a first width of a cross-section of the isolation layer that contacts the first surface is greater than a third width of a center cross-section of the isolation layer between the first surface and the second surface, and
a second width of a cross-section of the isolation layer that contacts the second surface is greater than the third width.

12. The charge pump circuit of claim 9, wherein the substrate is doped with a P-type impurity.

13. An image sensor comprising:
a pixel array comprising a plurality of pixels defined by a first isolation layer; and
a charge pump circuit in a semiconductor substrate comprising:
a first pump unit comprising a first capacitor and a first transistor, the first pump unit configured to generate a first node voltage at a first node by using a clock signal; and
a second pump unit comprising a second capacitor, a second transistor, and a third transistor, the second capacitor having a first terminal connected to the first node and a second terminal connected to the second transistor, the second pump unit configured to generate a negative output voltage by using the first node voltage, and
a body of the third transistor is physically isolated from a body of the second transistor by a second isolation layer formed through the semiconductor substrate.

14. The image sensor of claim 13, wherein the negative output voltage is provided to the first isolation layer.

15. The image sensor of claim 13, wherein the plurality of pixels each comprise:
a photoelectric transformation element configured to generate and accumulate optical charges in proportion to an amount of incident light;
a transmitting transistor configured to transmit the optical charges, which are accumulated in the photoelectric transformation element, to a floating diffusion region; and
a resetting transistor configured to reset a charge accumulated in the floating diffusion region, and
the negative output voltage is provided to a gate of the transmitting transistor.

16. The image sensor of claim 13, wherein the plurality of pixels each comprise:
a photoelectric transformation element configured to generate and accumulate optical charges in proportion to an amount of incident light;
a transmitting transistor configured to transmit the optical charges, which are accumulated in the photoelectric transformation element, to a floating diffusion region; and
a resetting transistor configured to reset a charge accumulated in the floating diffusion region, and
the negative output voltage is provided to a gate of the resetting transistor.

17. The image sensor of claim 13, wherein
the first pump unit outputs a first output voltage having a constant magnitude,
the second pump unit outputs a second output voltage having a magnitude greater than the magnitude of the first output voltage, and
at least one of the first output voltage and the second output voltage is selectively provided to the pixel array.

* * * * *